US012635211B2

(12) United States Patent
Mertens et al.

(10) Patent No.: US 12,635,211 B2
(45) Date of Patent: May 19, 2026

(54) METHOD OF FORMING A SEMICONDUCTOR DEVICE

(71) Applicant: IMEC vzw, Leuven (BE)

(72) Inventors: Hans Mertens, Leuven (BE); Sujith Subramanian, Leuven (BE)

(73) Assignee: IMEC vzw, Leuven (BE)

( * ) Notice: Subject to any disclaimer, the term of this patent is extended or adjusted under 35 U.S.C. 154(b) by 319 days.

(21) Appl. No.: 18/341,196

(22) Filed: Jun. 26, 2023

(65) Prior Publication Data

US 2023/0420544 A1      Dec. 28, 2023

(30) Foreign Application Priority Data

Jun. 27, 2022    (EP) ..................................... 22181159

(51) Int. Cl.
H10D 84/01        (2026.01)
H10D 30/01        (2025.01)
(Continued)

(52) U.S. Cl.
CPC ......... H10D 64/017 (2025.01); H10D 30/014 (2025.01); H10D 30/6729 (2025.01);
(Continued)

(58) Field of Classification Search
CPC .... H10D 62/121; H10D 30/024; H10D 30/62; H10D 30/6735; H10D 30/794;
(Continued)

(56) References Cited

U.S. PATENT DOCUMENTS

2019/0319095 A1 * 10/2019  Zhang .................. H10D 62/121
2020/0111798 A1    4/2020  Paul et al.
(Continued)

OTHER PUBLICATIONS

Extended European Search Report dated Nov. 30, 2022 in European Application No. 22181159.9 in 8 pages.
(Continued)

*Primary Examiner* — Moin M Rahman
(74) *Attorney, Agent, or Firm* — Knobbe, Martens, Olson & Bear, LLP

(57)            ABSTRACT
In one aspect, a method of forming a semiconductor device including a plurality of stacked transistor devices having a bottom transistor device and a top transistor device can include: forming a plurality of parallel fin structures on a substrate; forming a sacrificial gate across the fin structures; forming bottom source/drain bodies for each bottom transistor device by epitaxy; forming a bottom dummy contact layer covering the bottom source/drain bodies; forming top source/drain bodies for each top transistor device over the bottom dummy contact layer by epitaxy; depositing an insulating material over the bottom dummy contact layer and the top source/drain bodies; replacing the sacrificial gate with a functional gate stack by a replacement metal gate process; patterning holes extending through the insulating material, with each hole exposing an upper surface portion of the bottom dummy contact layer; replacing the bottom dummy contact layer with one or more contact metals, which can include etching the dummy material via the holes and thereafter depositing the one or more contact metals via the holes; and etching cuts through the contact metal via the holes.

18 Claims, 19 Drawing Sheets

(51) Int. Cl.

| | |
|---|---|
| *H10D 30/67* | (2025.01) |
| *H10D 62/10* | (2025.01) |
| *H10D 64/01* | (2025.01) |
| *H10D 84/03* | (2025.01) |
| *H10D 84/85* | (2025.01) |
| *H10D 30/43* | (2025.01) |

(52) U.S. Cl.
CPC ....... *H10D 30/6735* (2025.01); *H10D 62/121* (2025.01); *H10D 84/0167* (2025.01); *H10D 84/017* (2025.01); *H10D 84/0193* (2025.01); *H10D 84/038* (2025.01); *H10D 84/853* (2025.01); *H10D 30/43* (2025.01); *H10D 30/6757* (2025.01)

(58) Field of Classification Search
CPC .. H10D 30/797; H10D 62/115; H10D 62/151; H10D 62/292; H10D 62/822; H10D 64/017; H10D 64/021; H10D 64/257; H10D 64/62; H10D 30/014; H10D 30/0323; H10D 30/43; H10D 30/6744; H10D 30/6757; H10D 64/251; H10D 62/116; H10D 62/364; H10D 84/0193; H10D 84/853; H10D 84/85; H10D 30/6728; H10D 30/6733; H10D 62/118; H10D 89/931; H10D 64/252; H10D 84/0188; H10D 84/201; H10D 18/60; H10D 30/60–798; H10D 30/021–0415; H10D 84/83–859; H10D 84/0128; H10D 84/0167; H10D 62/85–854; H10D 30/751; H10D 30/027–0278; H10D 30/63; H10D 84/016; H10D 84/0195; H10D 30/501–509; H10D 30/673; H10D 30/689; H10D 30/6713; H10D 62/021; H10D 64/015; H10D 64/671; H10D 84/014; H10D 84/0158; H10D 84/0177; H10D 84/038; H10D 84/834; H10D 86/215; H10D 30/6215; H10D 30/0217; H10D 30/6729; H10D 84/017; H10D 88/00; H10D 84/0186; H10D 88/01; H01L 21/02532; H01L 21/02603; H01L 21/28568; H01L 21/30604; H01L 25/105; H01L 21/30625; H01L 21/6835; H01L 21/76224; H01L 21/31116; H01L 21/3065; H01L 21/02068; H01L 21/32134; H01L 21/32136; H01L 21/32137; H01L 21/3213; H01L 21/0228; H02K 15/027; A23B 2/783; A45C 11/003; A61K 40/4218; H10F 77/955; H10H 20/826; B82Y 10/00; H10B 63/34
See application file for complete search history.

(56) References Cited

U.S. PATENT DOCUMENTS

| | | |
|---|---|---|
| 2021/0098306 A1 | 4/2021 | Smith et al. |
| 2021/0265348 A1 | 8/2021 | Xie et al. |
| 2021/0366782 A1 | 11/2021 | Xie et al. |
| 2022/0093593 A1 | 3/2022 | Yang |

OTHER PUBLICATIONS

Subramanian et al., "First Monolithic Integration of 3D Complementary FET (CFET) on 300mm Wafers," 2020 IEEE Symposium on VLSI Technology, 2020, 2 pages.

* cited by examiner

140

130

156

156

156

154

154

150

156

154

150

METHOD OF FORMING A SEMICONDUCTOR DEVICE

CROSS-REFERENCE TO RELATED APPLICATIONS

This application claims foreign priority to European Patent Application EP 22181159.9, filed Jun. 27, 2022, the content of which is incorporated by reference herein in its entirety.

BACKGROUND

Technical Field

The disclosed technology generally relates to semiconductor devices and more particularly to methods of forming a semiconductor device having a plurality of stacked transistor devices, for example, a plurality of stacked transistor devices including a bottom transistor device and a top transistor device.

Description of the Related Technology

In striving to provide even more area-efficient circuit designs, vertically stacked transistor devices are being developed. One notable example is the complementary field-effect transistor (CFET) device in which two horizontal channel transistors of complementary conductivity types are stacked on top of each other (e.g., a p-channel field-effect transistor (pFET) bottom device and an n-channel field-effect transistor (nFET) top device, or vice versa). The CFET device allows a reduced footprint compared to a traditional side-by-side arrangement of a pFET and nFET.

Using what may be referred to as a "monolithic" process, a CFET device may be formed by patterning a deposited stack of channel layers top-down to form channel layers (e.g., into the form of nanosheets) for both the bottom device and the top device. After processing source and drain bodies (e.g., by epitaxy) and forming source and drain contacts for the bottom and top device, the lower and upper channel nanosheets may be provided with a gate stack, also formed in "monolithic" process wherein the gate patterning for the top and bottom device is performed simultaneously.

The stacking of the bottom and top devices however introduces challenges in the process flow, in particular related to the forming of source and drain contacts for the bottom and top devices.

SUMMARY OF CERTAIN INVENTIVE ASPECTS

In light of the above, it is an objective to provide a method facilitating forming of stacked transistor devices, in particular facilitating source and drain contact formation for the bottom and top devices. Further and alternative objectives may be understood from the following.

According to an aspect of the disclosed technology, there is provided a method of forming a semiconductor device comprising a plurality of stacked transistor devices comprising a bottom transistor device and a top transistor device. The method can include:

forming a plurality of parallel fin structures on a substrate, each comprising a bottom device sub-stack comprising a number of bottom channel layers and a top device sub-stack comprising a number of top channel layers;

forming a sacrificial gate across the fin structures;

forming bottom source/drain bodies for each bottom transistor device by epitaxy;

forming a bottom dummy contact layer covering the bottom source/drain bodies, comprising depositing a dummy material over the source/drain bodies, and removing a top portion of the dummy material by an etch back process such that a bottom portion of the dummy material remains to cover the bottom source/drain bodies;

forming top source/drain bodies for each top transistor device over the bottom dummy contact layer by epitaxy;

depositing an insulating material over the bottom dummy contact layer and the top source/drain bodies;

subsequent to depositing the insulating material, replacing the sacrificial gate with a functional gate stack by a replacement metal gate process;

subsequent to the replacement metal gate process, patterning holes extending through the insulating material, each hole exposing an upper surface portion of the bottom dummy contact layer;

replacing the bottom dummy contact layer with one or more contact metals, comprising etching the dummy material via the holes and thereafter depositing the one or more contact metals via the holes;

etching cuts through the contact metal via the holes, thereby forming bottom source/drain contacts for the bottom transistor devices; and filling the cuts and holes with an insulating material.

According to the method, a bottom dummy contact layer covering the bottom source/drain bodies can be formed. The bottom dummy contact layer may more specifically comprise a plurality of layer portions, each covering the source/drain bodies on a respective side of the sacrificial gate. The bottom dummy contact layer may for brevity hereinafter also be referred to as the "dummy layer"). The layer portions of the dummy layer may in the following also be referred to as "dummy contact blocks".

The dummy layer can provide masking of the bottom source/drain bodies during the forming of the top source/drain bodies.

As the dummy layer can be formed prior to the forming of the top source/drain bodies and the replacement metal gate (RMG) process, and can be subsequently replaced with one or more contact metal (e.g., in a "replacement metal contact process"), a risk of a degraded source/drain contact-body interface due to the elevated temperatures typical for source/drain epitaxy and RMG processes may be mitigated.

Since the dummy layer can be defined using an etch back process, each dummy contact block may form a continuous elongated block, extending un-interrupted across all of the source/drain bodies on the respective side of the sacrificial gate structure. This can facilitate providing a relatively large access area towards the dummy contact blocks for the subsequent replacement metal contact process.

By etching cuts through the contact metal via the holes, the metal contact body (e.g., formed by the contact metal(s) deposited in the RMG process) may be patterned into a number of discrete bottom source/drain contacts, e.g., each bottom source/drain contact contacting one or more respective bottom source/drain bodies.

As will be further discussed in connection with various embodiments in the following, the dummy material may be an amorphous silicon (a-Si) or silicon-germanium (a-SiGe) material, or a first insulating material (e.g., an oxide) different from the insulating material deposited over the bottom portion of the dummy material and the top source/drain bodies (e.g., a "second" insulating material). However, more generally the dummy material may also be another non-metal dummy material which may be removed in the replacement metal contact process by selective etching.

The insulating material filling (e.g., re-filling) the cuts and holes may be a same insulating material as the insulating material deposited over the bottom dummy contact layer and the top source/drain bodies, or a different insulating material (e.g., a "third" insulating material).

Since the method may comprise processing of fin structures, each comprising both a bottom and a top device sub-stack, the method can lend itself for forming of a "monolithic" stacked transistor device, such as a monolithic CFET device. Although this represents an advantageous use-case, it is contemplated that the method may be used also to form other non-CFET type stacked transistor devices with individual source/drain bodies and contacts for the bottom and top device.

The term "fin structure" as used herein can refer to a layer stack with a longitudinal dimension oriented in a horizontal direction (e.g., a "first" horizontal direction) along the substrate and protruding vertically therefrom.

A "layer stack" can refer to a structure of layers, sequentially formed on top of each other.

As used herein, reference to "each" of a particular element (e.g., "each bottom transistor device" or "each top transistor device") may refer to two or more of the elements, and may or may not refer to every one of the elements in the structure. For example, "each bottom transistor device" may refer to individual ones of a plurality of bottom transistor devices and not necessarily every single bottom transistor device in the structure.

The terms "bottom" and "top device sub-stack" can designate respectively a bottom and top subset of consecutive layers of (e.g., the layer stack of) each fin structure, wherein the top device sub-stack can be arranged over the bottom device sub-stack. The bottom device sub-stack and the top device sub-stack may comprise a respective number channel layers (e.g., at least one).

Relative spatial terms such as "vertical", "upper", "lower", "top", "bottom", "stacked on top of", can herein be understood as denoting locations or orientations within a frame of reference of the stacked transistor device. In particular, the terms may be understood as locations or orientations along a normal direction to the substrate, or equivalently in relation to a bottom-up direction of the bottom and top device sub-stacks. Correspondingly, terms such as "lateral" and "horizontal" can be understood as locations or orientations parallel to the substrate, e.g., parallel to an upper surface or the main plane of extension of the substrate.

In some embodiments, the dummy material may be an amorphous silicon (a-Si) or silicon-germanium (a-SiGe) material, and wherein the method may further comprise, after the etch back process of removing a top portion of the dummy material, oxidizing a top thickness portion of the bottom portion of the dummy material, thereby forming the bottom dummy contact layer and a capping layer of oxidized dummy material on top.

An amorphous a-Si or a-SiGe may be etched with a high degree of selectivity with respect to typical insulating materials (e.g., oxides or other inter-layer dielectrics), thereby facilitating the replacement metal contact process.

By further providing the dummy layer with a capping layer of oxidized dummy material (e.g., $SiO_x$ or $SiGeO_x$) the a-Si or a-SiGe material may be masked during the forming of the top source/drain bodies, e.g., counteracting epitaxy of source/drain material on the dummy layer. Using specifically an oxidation process can allow the capping layer to be formed in an area-selective manner, avoiding the need for additional capping material etching steps in some implementations. A remaining thickness portion of the (e.g., non-oxidized) dummy material can define a height of the bottom source/drain contacts in various instances.

In some embodiments, the replacing of the bottom dummy contact layer may further comprise etching the dummy material selectively to the oxidized dummy material, wherein subsequent to etching the cuts through the contact metal, a capping layer portion can remain on top of each bottom source/drain contact.

The capping layer portions may further provide a function of bottom-top source/drain isolation, wherein the forming of the source/drain isolation may in various instances, not require an additional etch back of insulating material as in other CFET fabrication.

In embodiments comprising the capping layer, the holes may be patterned to extend through both the insulating material and the capping layer. Each hole may thereby expose an upper surface portion of the dummy contact layer underneath the capping layer.

In alternative embodiments, the dummy material may be a first insulating material and the second insulating material (e.g., the insulating material deposited over the bottom dummy contact layer and the top source/drain bodies) may be different from the first insulating material, and wherein the replacing of the bottom dummy contact layer may comprise etching the first insulating material selectively to the second insulating material.

Forming the dummy layer of an insulating material (e.g., an oxide or other inter-layer dielectric) may allow forming the dummy layer to be relatively inert to an epitaxy process which may be used for forming the top source/drain bodies.

In some embodiments, the first insulating material may be a silicon-comprising oxide (e.g., $SiO_x$) and the second insulating material may be a silicon-comprising oxide material with a greater carbon content than the first insulating material (e.g., SiOC).

Different carbon content can allow tuning of the relative etch rates of the first and second insulating materials, to facilitate a selective etching of the dummy material/first insulating material during the replacement metal contact process. A carbon content of the second insulating material may e.g., be 10-30 percentage units greater than a carbon content of the first insulating material.

In some embodiments, the method may further comprise, subsequent to filling the cuts and holes with the (e.g., first or third) insulating material, etching contact holes in the (e.g., first) insulating material deposited over the top source/drain bodies, wherein the etching can be stopped prior to exposing the bottom source/drain contacts, and forming top source/drain contacts in the contact holes. Top source/drain contacts for the top transistor devices, electrically insulated from the bottom source/drain contacts may thereby be formed.

In some embodiments, the method may further comprise forming a contact etch stop layer on the top source/drain bodies prior to depositing the insulating material over the bottom dummy contact layer and the top source/drain bodies, wherein the method may further comprise opening the contact etch stop layer from the contact holes and thereafter forming the top source/drain contacts.

The top source/drains may thereby be masked from the process conditions during the deposition of the insulating material and the patterning of the contact holes. For example, the contact etch stop layer may be used as an etch stop layer during etching of the contact holes in the insulating material.

In some embodiments, each hole may be formed at a position between a pair of adjacent top source/drain bodies and with a width such that opposing side surfaces of the pair of adjacent top source/drain bodies remain covered by the insulating material. In some instances, the holes may be formed such that they do not expose the top source/drain bodies.

In some embodiments, a hole may be patterned between each pair of adjacent top source/drain bodies. In addition to increasing the access area towards the dummy contact blocks for the subsequent replacement metal contact process, this can further allow forming of individual bottom source/drain contacts for each bottom source/drain as the contact metal is etched back via the holes.

In some embodiments, each fin structure may further comprise a middle insulating layer intermediate the bottom device sub-stack and the top device sub-stack, wherein the etch back process of the dummy material may be stopped at a level of the middle insulating layer.

The presence of the middle insulating layer may provide electrical separation between the channel layers of the bottom and top device sub-stacks.

In some embodiments, the sacrificial gate may be formed to overlap/extend across a respective channel region of each fin structure, and wherein the method may further comprise:
  etching back the fin structure at either side of the sacrificial gate;
  forming a cover spacer with an extension to cover end surfaces of the upper device sub-stack defined by the etch back at either side of the sacrificial gate, and to expose end surfaces of the lower device sub-stack defined by the etch back at either side of the sacrificial gate; and
  thereafter forming the bottom source/drain bodies while using the cover spacer as an epitaxy mask.

The cover spacer may counteract epitaxy on the end surfaces of the top device sub-stack, so that the bottom source/drain bodies may be formed selectively on the bottom device sub-stack.

The end surfaces of the upper device sub-stack and the end surfaces of the bottom device sub-stack may comprise end surfaces of channel layer portions of the top and bottom device sub-stacks remaining in the channel regions after the etch back of the fin structure.

In some embodiments, the bottom source/drain bodies and the top source/drain bodies may be oppositely doped. This may advantageously be combined with embodiments comprising forming of the cover spacer.

BRIEF DESCRIPTION OF THE DRAWINGS

The above, as well as additional objects, features and advantages, may be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

Embodiments of methods of forming stacked transistor devices, such as complementary field-effect transistor (CFET) devices, will in the following be described with reference to the figures.

Figure 1:
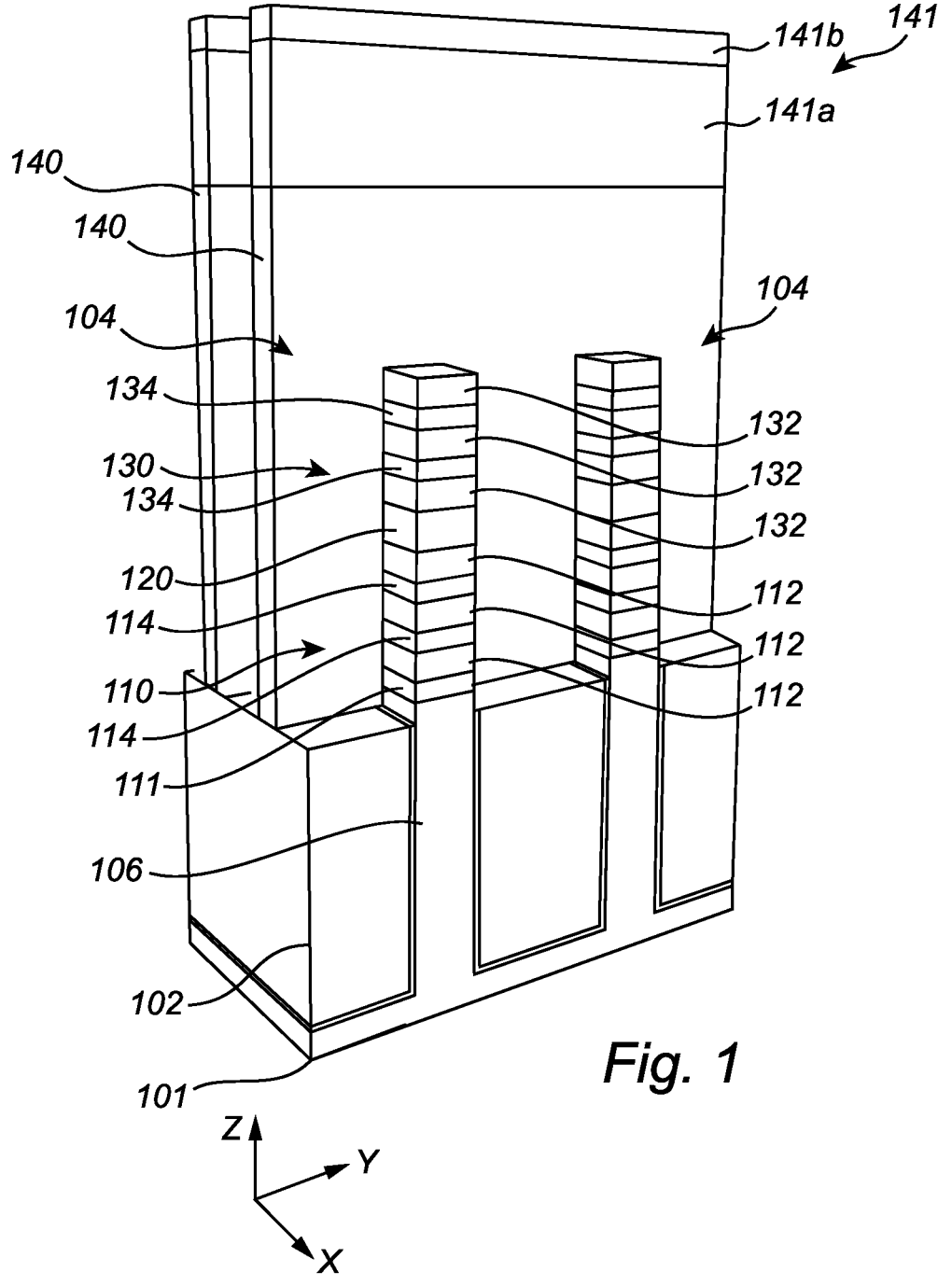
FIGS. 1, 2A, 2B, 3, 4, 5, 6, 7, 8, 9, 10, 11, 12, 13, 14, and 15 depict various intermediate structures at various stages of a method of forming stacked transistor devices according to one embodiment.

In FIG. 1, a plurality of parallel fin structures 104 (of which two are shown in FIG. 1) has been formed on a substrate 101. The substrate 101 may be any semiconductor substrate suitable for complementary metal-oxide semiconductor (CMOS) processing. The substrate 101 may be a single-layered semiconductor substrate, for instance formed by a bulk substrate such as a silicon (Si) substrate, a germanium (Ge) substrate or a silicon-germanium (SiGe) substrate. A multi-layered/composite substrate is however also possible, such as an epitaxially grown semiconductor layer on a bulk substrate, or a semiconductor-on-insulator (SOI) substrate, such as a Si-on-insulator substrate, a Ge-on-insulator substrate, or a SiGe-on-insulator substrate.

Each fin structure 104 can be formed by an elongated fin-shaped layer stack with a longitudinal dimension oriented in a first horizontal direction X along the substrate 101 and protruding in a vertical direction Z from the substrate 101. A width dimension of each fin structure 104 can be oriented in a second horizontal direction Y transverse to the X-direction.

Each fin structure 104 can have a corresponding composition and comprise, in a bottom-up direction, a bottom device sub-stack 110, a middle insulating layer 120 on the bottom device sub-stack 110, and a top device sub-stack 130 on the middle insulating layer 120.

Each of the bottom device sub-stack 110 and the top device sub-stack 130 can comprise a respective number of channel layers 114 and 134, e.g., two bottom channel layers 114 and two top channel layers 134 as shown. However, this is merely one example and fewer and more bottom and top channel layers 114, 134 are also possible.

In the illustrated embodiment, the bottom device sub-stack 110 further comprises a number of sacrificial layers 112 arranged alternatingly with the bottom channel layers 114, as seen along the Z-direction. Correspondingly, the top device sub-stack 130 further comprises a number of sacrificial layers 132 (e.g., also in the shape of nanosheets) arranged alternatingly with the top channel layers 134. As will be further described below, the alternating arrangement of sacrificial layers 112, 132 and channel layers 114, 134 of the bottom and top device sub-stacks 110, 130 can enable forming bottom and top transistor devices comprising a number of channel layers or channel nanosheets with a gate-all-around configuration. The illustrated composition of the bottom and top device sub-stacks 110, 130 is however merely an example, and it is also possible to form a bottom device sub-stack 110 and/or a top device sub-stack 130 comprising only a single channel layer 114, 134 and no sacrificial layers. Thereby, a bottom and/or top transistor device comprising only a single channel layer with a double- or tri-gate configuration may be formed.

The bottom and top channel layers 114, 134 may be formed by a same or a respective semiconductor channel material, such as Si, Ge or SiGe, with a same or different Ge-content. The sacrificial layers 112, 132 may be formed by a same or a respective sacrificial semiconductor material, such as SiGe with a Ge-content different from a Ge-content of the bottom and top channel layers 114, 134. For example, the channel layers 114, 134 may be formed of $SiGe_x$ where x is 0, and the sacrificial layers 112, 132 may be formed of $SiGe_y$, where y is in a range from 0.15 to 0.35. For example, a SiGe material with a greater Ge content than another Si or SiGe material may be etched selectively (e.g., at a greater rate) using an HCl-based dry etch. A further example is an etching chemistry including an ammonia peroxide mixture (APM). However, other appropriate etching processes (wet or dry) allowing selective etching of higher Ge-content SiGe material with respect to lower Ge-content SiGe (or Si) materials may also be employed for this purpose.

The channel layers 114, 134 and the sacrificial layers 112, 132 may each be formed in the shape of nanosheets (e.g., bottom and top channel nanosheets 114, 134 and sacrificial nanosheets 112, 132, respectively). The channel layers 114, 134 and the sacrificial layers 112, 132 may for example be formed with a width (along Y) to thickness (along Z) ratio greater than 1, such as a width in a range from 10 nm to 30 nm and a thickness in a range from 3 nm to 10 nm.

The semiconductor layers of the fin structures 104 may each be epitaxial layers, e.g., formed of epitaxially grown or deposited semiconductor material. Epitaxial deposition techniques, such as chemical vapor deposition (CVD) or physical vapor deposition (PVD) of Si and SiGe, allowing forming of high quality material crystalline (e.g., single-crystalline) nanosheets or layers may be used.

The middle insulating layer 120 may be formed of an insulating material, such as an oxide or a nitride. For example, the middle insulating layer 120 may comprise or be formed of $SiO_2$, SiN, SiC, SiCN, SiOCN, SiOBCN or SiON. The middle insulating layer 120 may for example be formed with a thickness in a range from 20 to 50 nm. Although referred to and illustrated as a single layer, the middle insulating layer 120 may also be formed as a composite layer structure comprising e.g., a stack of two or more different insulating layers.

The fin structures 104 may be formed by patterning a layer stack comprising a bottom layer sub-stack and a top layer sub-stack bonded to the bottom layer stack by one or more bonding layers of oxide and/or nitride, wherein the bottom and top device sub-stacks 110, 130 are formed in the bottom and top layer sub-stacks, respectively, and the middle insulating layers 120 are formed in the bonding layer(s). As shown in FIG. 1, the fin patterning may extend into an upper thickness portion of the substrate 101 to form a base portion 106 underneath the bottom layer sub-stacks 110. Any patterning techniques may be used for patterning the hard mask layer, e.g., single patterning techniques such as lithography and etching ("litho-etch") or multiple-patterning techniques such as (litho-etch)$^x$, self-aligned double or quadruple patterning (SADP or SAQP).

After forming the fin structures 104, base portions 106 of the fin structures 104 may be surrounded by shallow-trench-isolation material such as $SiO_2$, e.g., deposited by CVD such as flowable-CVD (FCVD), or some other low-k inter-layer dielectric suitable for shallow trench isolation (STI).

As further shown in FIG. 1, a plurality of sacrificial gates 140 have been formed to extend in parallel across the fin structures 104, along the Y-direction. Each sacrificial gate 140 may overlap a respective channel region of each fin structure 104. The sacrificial gates 140 may be formed by depositing a sacrificial gate layer, e.g., of a-Si, and patterning the plurality of sacrificial gates 140 therein using single- or multiple-patterning techniques. Reference sign 141 denotes a stack of hard mask layers 141a, 141b (e.g., an oxide layer on a nitride layer) remaining on the sacrificial gates 140 after patterning the sacrificial gates 140.

Figure 2A:
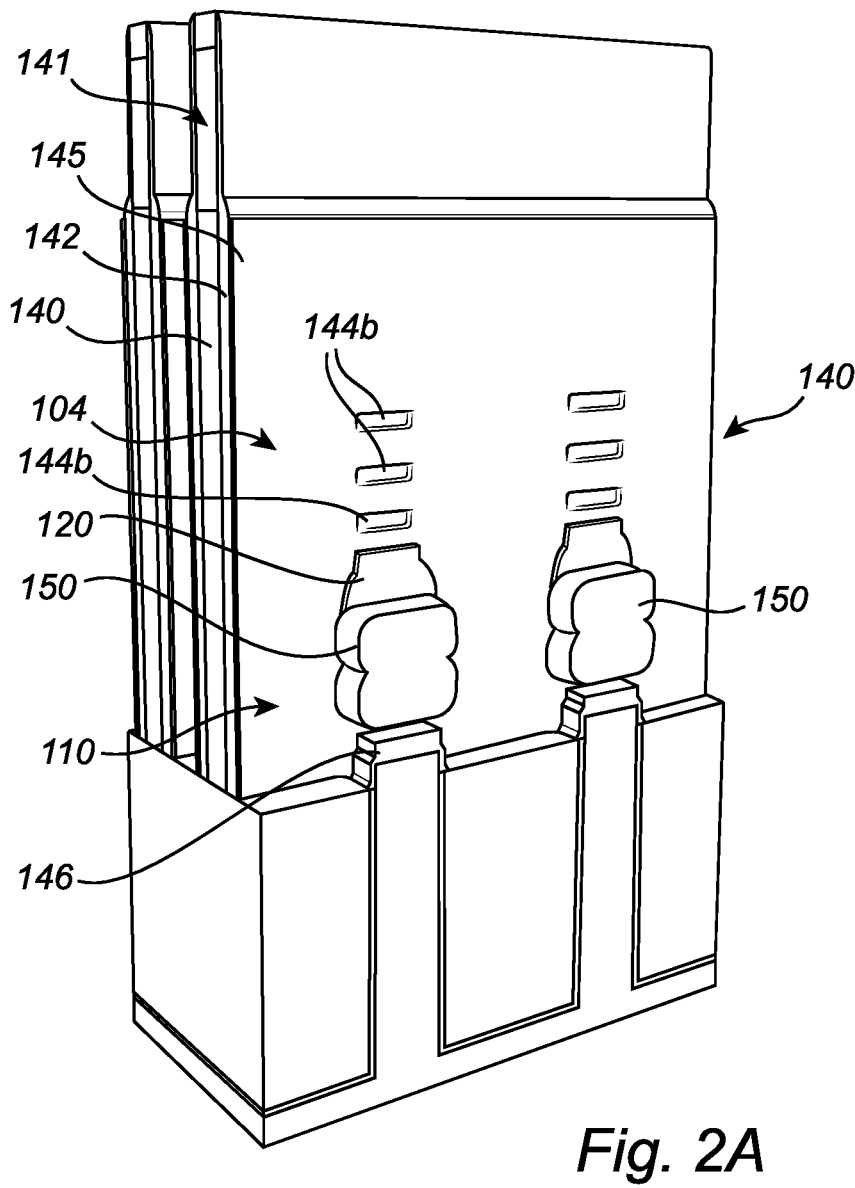
Figure 2B:
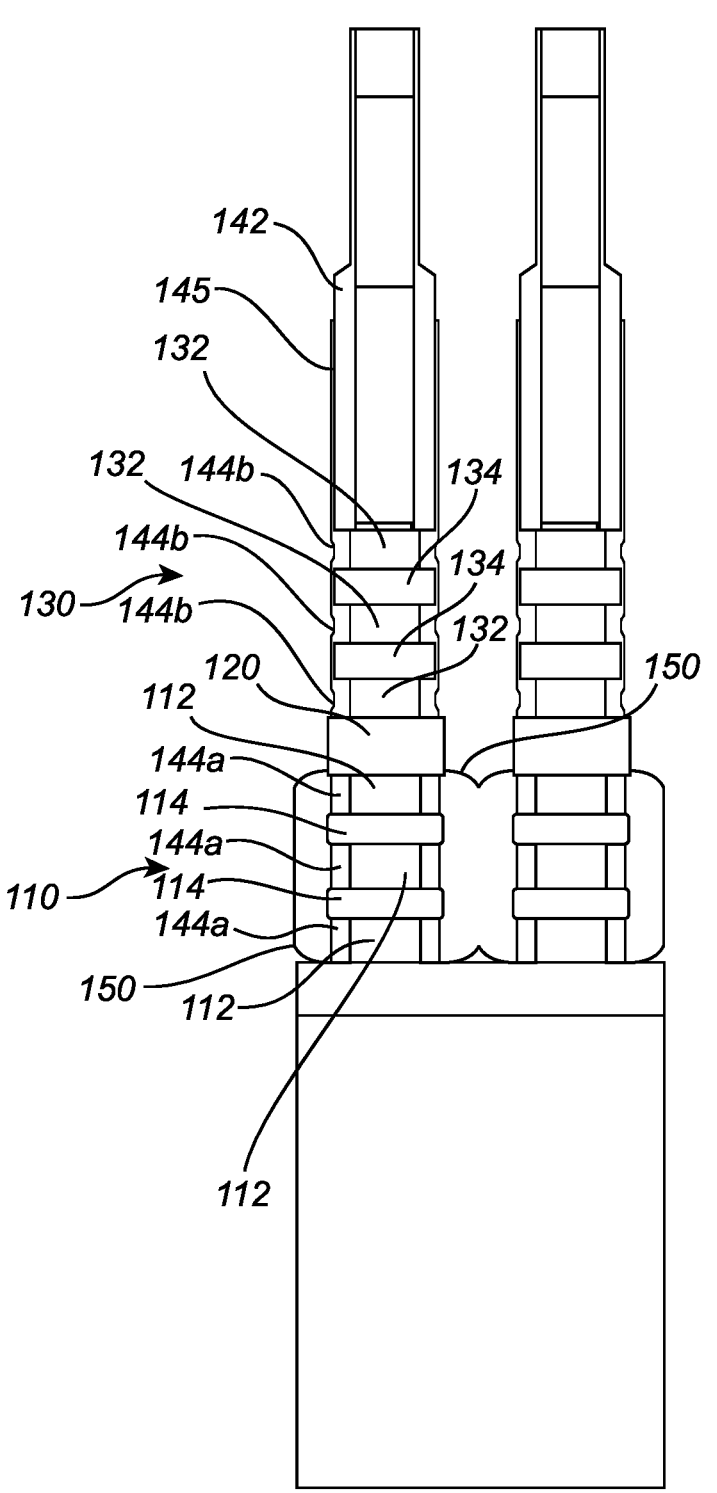

In FIG. 2A, bottom source/drain bodies 150 for each bottom transistor device have been formed by epitaxy at either side of each sacrificial gate 140. FIG. 2B shows a cross sectional side view of the structure, taken along the X-direction of one of the fin structures 140.

Prior to the epitaxy, the fin structures 104 have been recessed by etching back the fin structures 104 in a top-down direction (e.g., negative Z) at either side of each sacrificial gates 140, while using the sacrificial gates 140 as an etch mask. The etching may extend through the top device sub-stack 130, the middle insulating layer 120 and the bottom device sub-stack 110 of each fin structure 104. Each fin structure 104 can thereby be partitioned into a plurality of fin structure portions, each comprising a respective bottom device sub-stack 110, a respective middle insulating layer 120 and a respective top device sub-stack 140, preserved in the channel region underneath each sacrificial gate 140. The etch back thus can define end surfaces of the (respective) bottom and top device sub-stacks 110, 130 exposed at either side of each gate structure 140. The bottom source/drain bodies 150 may accordingly be formed on the end surfaces of the bottom channel layers 114 of the respective bottom device sub-stacks 110.

The sacrificial gates 140 may prior to the recess be provided with a gate spacer 142, extending along sidewalls of the sacrificial gates 140. The gate spacer 142 may be formed of any gate spacer material (e.g., a nitride such as SiN), and be conformally deposited (e.g., by atomic layer deposition or ALD). The gate spacer material may be recessed together with the fin structures 104.

To facilitate among others a subsequent "channel release", to be described below, so-called "inner spacers" 144 may be formed on end surfaces of the sacrificial layers 112, 132 prior to forming the bottom source/drain bodies 150. Inner spacers may be formed by laterally recessing (e.g., etching back) the sacrificial nanosheets 112, 132 from both sides of the sacrificial gate 140 (along the X and negative X directions) using an isotropic etching process selective to the sacrificial material, and filling the recesses with an inner spacer material (e.g., an ALD-deposited oxide, nitride or carbide). The inner spacers 144 may mask the bottom and top source/drain bodies 150, 160 during a subsequent channel release step described below. For example, inner spacers for the bottom device and the top device may be formed sequentially, interleaved with the recessing of the fin structures 140. For example, the recessing of the fin structures 104 may be divided into two sub-steps, a first sub-step of recessing the upper device sub-stack 130 and a second sub-step of recessing the bottom device sub-stack 110. The recessing of the first sub-step may e.g., be stopped on or within the middle insulating layer 120. After the first sub-step of the recessing, inner spacers 144b may be formed for the top device. The second sub-step of the recessing may then be performed, subsequent to which inner spacers 144a may be formed for the bottom device.

The source/drain bodies 150 may be doped with a desired conductivity type for the bottom transistor devices, e.g., p-type bodies on SiGe bottom channel layers 114 or n-type bodies on Si-channel bottom channel layers 114. The doping may be provided by in-situ doping.

To allow selective epitaxy on the bottom channel layers 114, the epitaxy may be preceded by forming of a cover spacer 145 with an extension to cover the end surfaces of the each upper device sub-stack 130, and to expose the end surfaces of each lower device sub-stack 110. The bottom source/drain bodies 150 may thereafter be formed while using the cover spacer 145 as an epitaxy mask.

Also the formation of the cover spacer 145 may be interleaved with the sub-steps of recessing the fin structures 104. According to such an interleaved approach, the cover spacer 145 may be deposited after the first sub-step of recessing the fin structures 104, e.g., after forming the inner spacers 144b for the top device. The cover spacer 145 may accordingly cover the inner spacers 144b. The second sub-step of the recessing may then be performed wherein the cover spacer 145 accordingly may be formed to cover the end surfaces of the channel layers 134 and expose the end surfaces of the channel layers 114.

While the aforementioned interleaved approaches of forming the inner spacers 144 and the cover spacer 145 amounts to an efficient process flow, other approaches are also possible. For instance, the inner spacers 144 may be formed simultaneously for the bottom and top devices after the recess of the fin structures 104 is completed: A block material may be deposited at either side of sacrificial gates 140 and be etched back to a level intermediate the bottom device sub-stack 110 and the top device sub-stack 130. A cover spacer layer may then be conformally deposited and subsequently etched back top-down (e.g., using an aniso-tropic dry etch) to remove portions of the cover spacer layer deposited on an upper surface of the block material, such that portions of the cover spacer layer remain to form the cover spacer 145 on vertically oriented surfaces of the device structure, comprising in particular the end surfaces of the channel layers 134. The block material may then be removed selectively to the cover spacer 145.

The use of a cover spacer 145 to enable selective epitaxy on the bottom channel layers 114 is however merely one example and other process techniques, such as Si/SiGe area selective epitaxy, facilitating selective formation of the source/drain bodies 150 on the end surfaces of the lower device sub-stacks 110 may also be used.

To facilitate forming of a bottom isolation layer under-neath the bottom transistor device, each fin structure 104 may as shown in FIG. 1 further comprise a bottom sacrificial layer 111, underneath a bottom-most sacrificial layer 112 and a bottom-most channel layer 114 of the bottom device sub-stack 110. The bottom sacrificial nano sheet 106 may be formed of a semiconductor material ("bottom sacrificial material") different from the sacrificial layers 112, 132 and the channel layers 114, 134, for instance of SiGe with a Ge-content different from a Ge-content of the channel layers 114, 134. For example, the bottom and top channel layers 114, 134 may be formed of $SiGe_x$ where x is 0, the sacrificial layers 112, 132 may be formed of $SiGe_y$, where y is in a range from 0.15 to 0.35, and the bottom sacrificial layer 111 may be formed of $SiGe_z$, where z≥y+0.15. The bottom sacrificial layer 111 may, subsequent to forming the sacri-ficial gates 140 and prior to recessing the fin structures 104, be removed by selectively etching the bottom sacrificial layer 111, and subsequently filling the thusly formed longi-tudinal cavity in the fin structure 104 with an insulating material (e.g., a nitride or oxide) for instance deposited by atomic layer deposition (ALD) to form a bottom isolation layer 146 underneath the bottom channel layers 114, as shown in FIG. 2B. During the replacement process the fin structures 104 may be supported by the sacrificial gates 140.

According to an alternative approach of forming the middle insulating layer 120, the layer stack in which the fin structures 104 are patterned may comprise a middle sacri-ficial layer of a same material as the bottom sacrificial layer. The middle sacrificial layer may then be removed simultaneous to the bottom sacrificial layer 111 wherein the thusly formed longitudinal cavity between the bottom and top device sub-stacks, and the cavity underneath the bottom device sub-stack may be simultaneously filled with the insulating material to create the bottom isolation layer 146 and the middle insulating layer 120. As may be appreciated, a corresponding approach may be used to form the middle insulating layer 120 even if no bottom isolation layer 146 is to be formed (wherein no bottom sacrificial layer 111 need be present).

The bottom sacrificial layer 111 and/or the middle insu-lating layer 120 may in particular be formed by a portion of the gate spacer material. The gate spacer material may be deposited after removing the bottom sacrificial layer 111 and the middle sacrificial layer, wherein the gate spacer material may, in addition to being deposited along the sidewalls of the sacrificial gates 140, fill the longitudinal cavities under-neath the bottom device sub-stacks and/or between the bottom and top device sub-stacks to form the bottom isola-tion layer 146 and/or the middle insulating layer 120.

Figure 3:
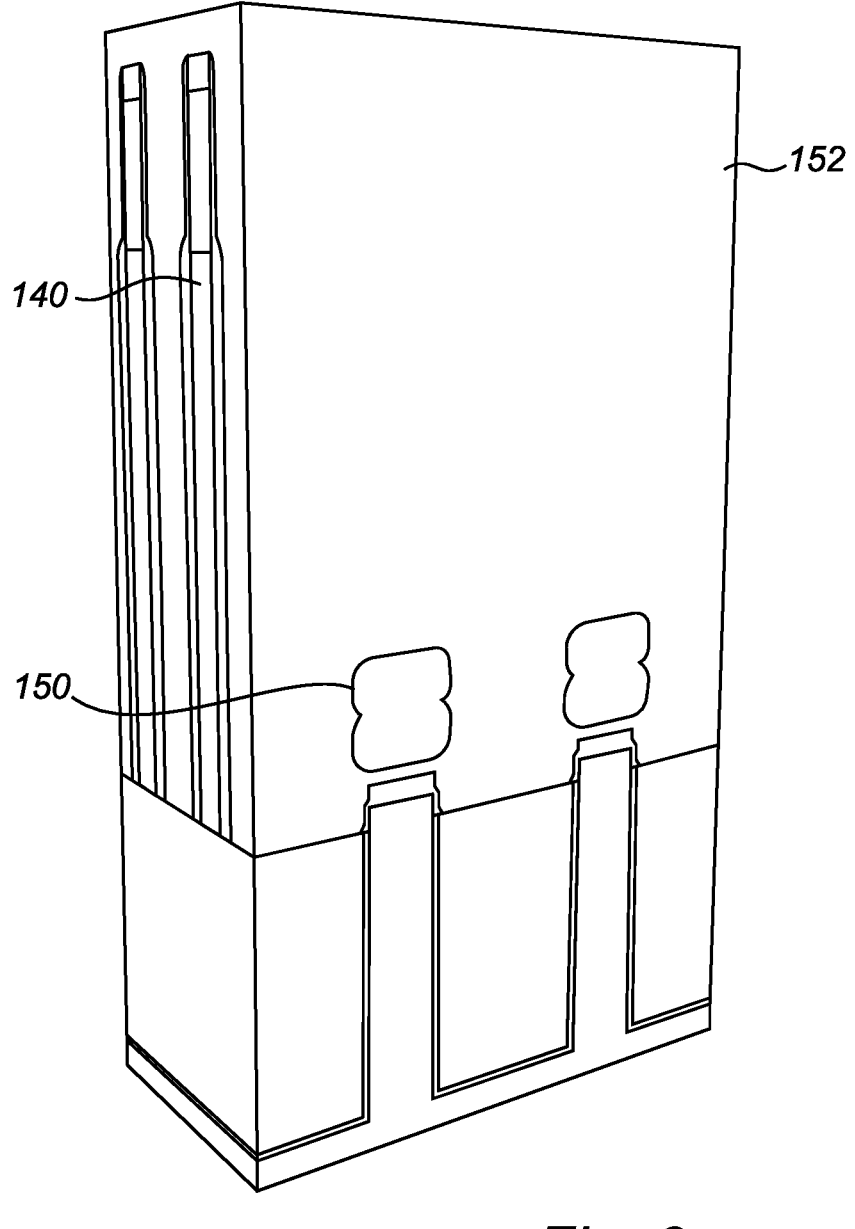
Figure 4:
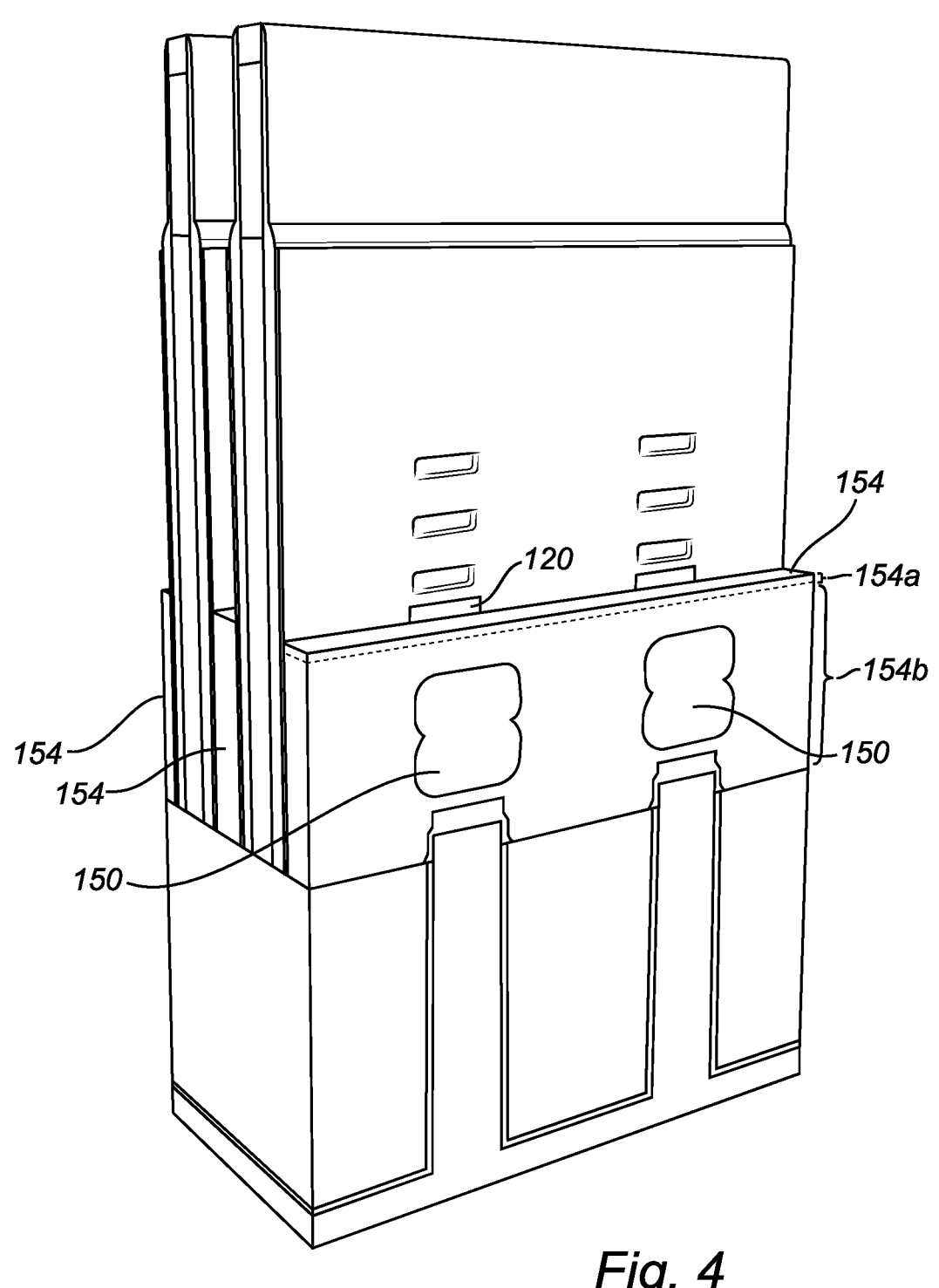
Figure 5:
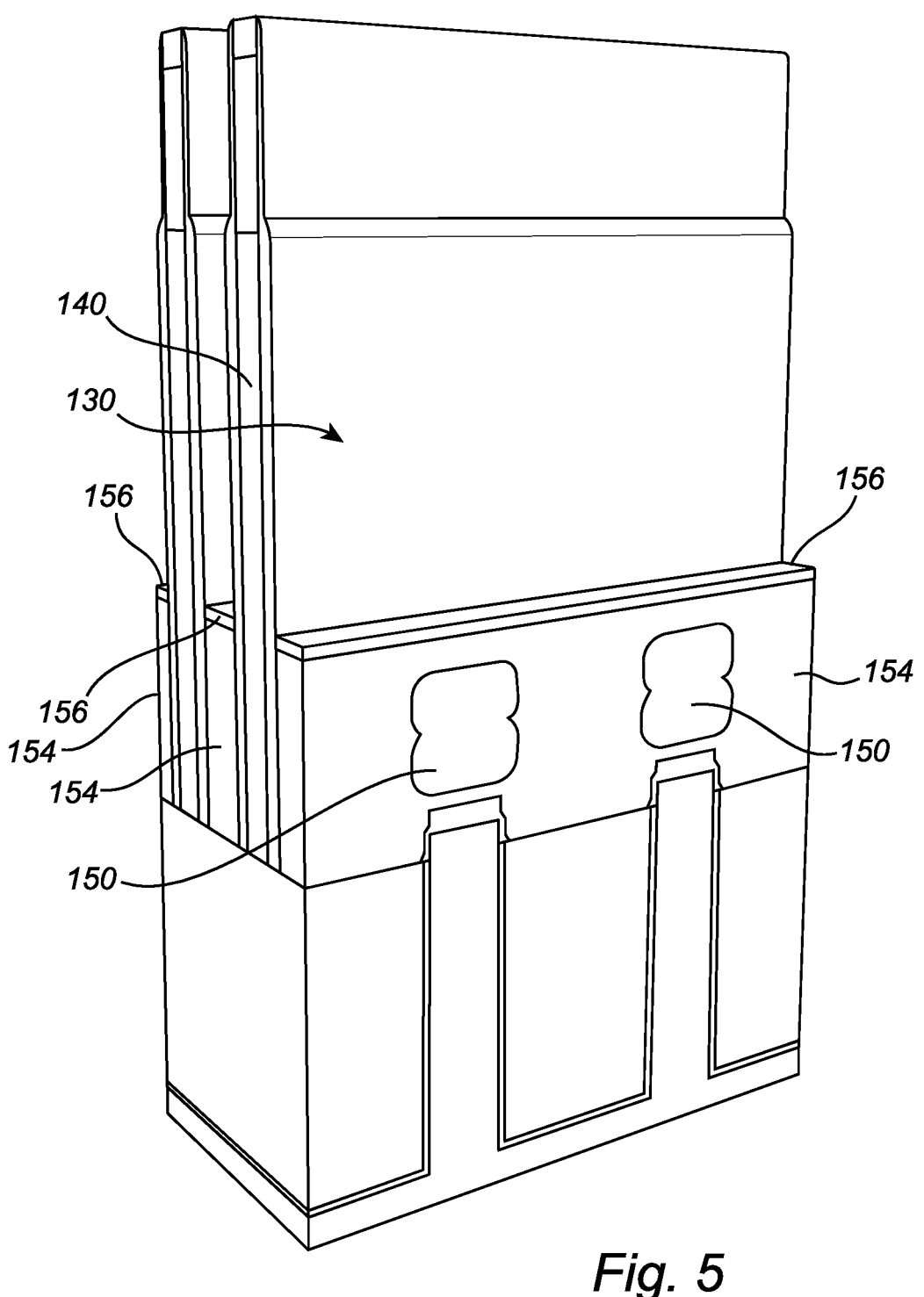

FIGS. 3-5 depict forming of a bottom dummy contact layer 154 (dummy layer 154) covering the bottom source/drain bodies 150 at either side of each sacrificial gate 140, with a capping layer 156 on top. In FIG. 3, a dummy material 152 of a-Si or a-SiGe has been deposited over the source/drain bodies 150 and the sacrificial gate structures 140, e.g., by physical vapor deposition (PVD) or chemical vapor deposition (CVD). The dummy material 152 may be deposited top-down to surround and cover the sacrificial gates 140 and the bottom source/drain bodies 160, and e.g., form an overburden over the sacrificial gates 140.

In FIG. 4, a top portion of the dummy material 152 has been removed by an etch back process such that a bottom portion 154 of the dummy material remains to cover the bottom source/drain bodies 150 at either side of each sac-rificial gate structure 140. The etch back process may more specifically be stopped at a level between the top and bottom sub-stacks, e.g., coinciding with a level of the middle insulating layer 120. Reference signs 154a and 154b denote a top and bottom thickness portion of the bottom portion 154.

In FIG. 5, the top thickness portion 154a of the bottom portion 154 of the dummy material has been oxidized, thereby forming the dummy layer 154 as the remaining non-oxidized bottom thickness portion 154b and the capping layer 156 of oxidized dummy material on top. A thickness of the capping layer 156 can be such that it can be preserved after subsequent process steps such as removal of the cover spacer 145 and epitaxy preclean before top source/drain formation. The thickness of the capping layer 156 may for instance be in a range from 3 to 20 nm. The oxidation process may be performed in an ambient temperature of 800° C. or less, or 500° C. or less, to limit oxidation of other materials present in the device structure as well as impact on the doping concentration of the bottom source/drain bodies 150.

The dummy contact layer 154 is as shown thus composed of a plurality of individual layer portions or "dummy contact blocks", each covering the bottom source/drain bodies 150 on a respective side of a respective sacrificial gate 140. Each dummy contact block 154 can form a continuous block (e.g., elongated or line-shaped) with a longitudinal dimension oriented along the Y-direction. Each dummy contact block 154 can extend uninterrupted over and across the bottom source/drain bodies 150 at a respective side of a respective sacrificial gate 140. Each dummy contact block 154 can be covered by a respective portion of the capping layer 156.

Figure 6:
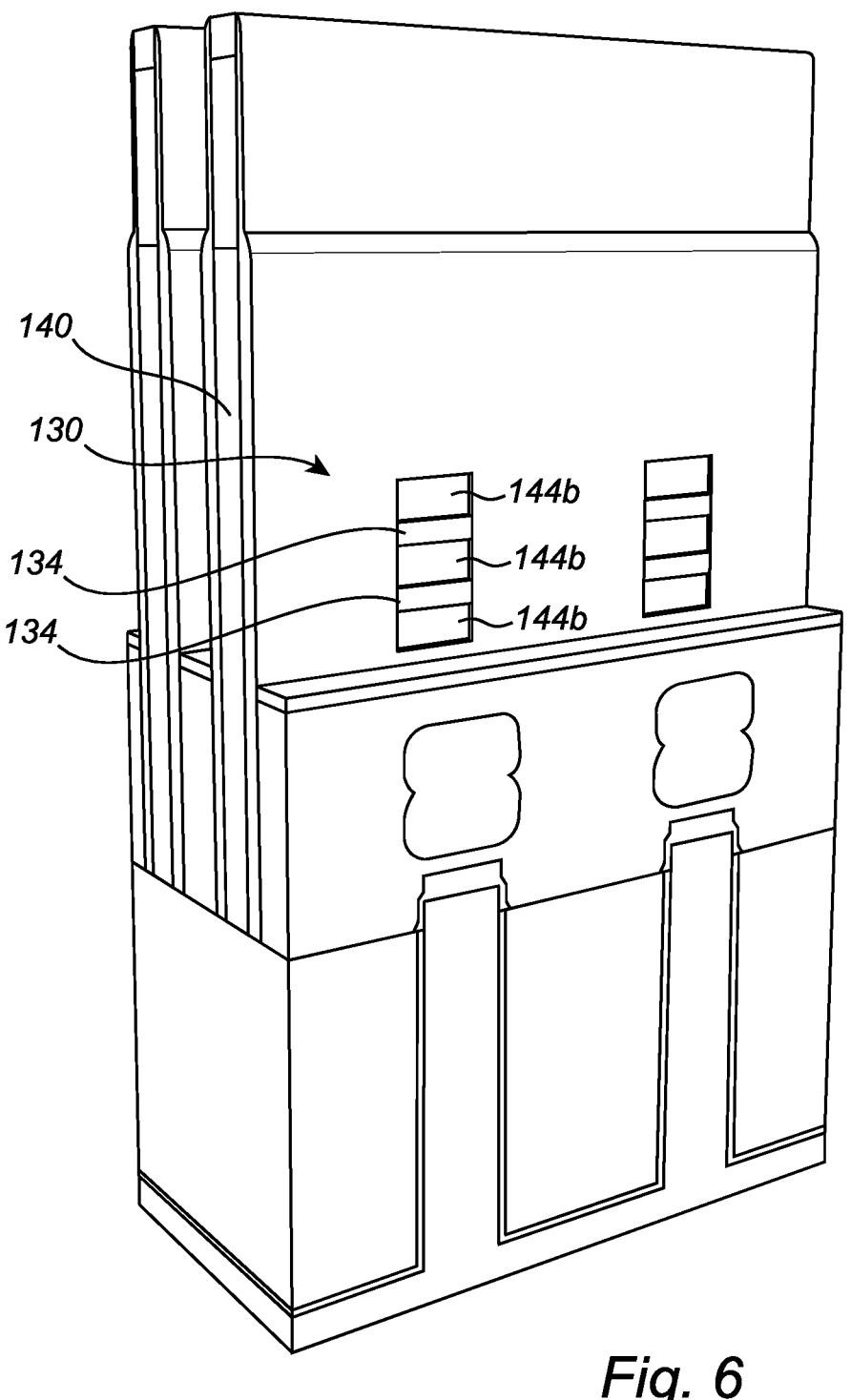

In FIG. 6, the cover spacer 145 has been removed to expose the end surfaces of the top channel layers 134 of each top device sub-stack at either side of each sacrificial gate 140. The removal of the cover spacer 145 further can expose the inner spacers 144b.

Figure 7:
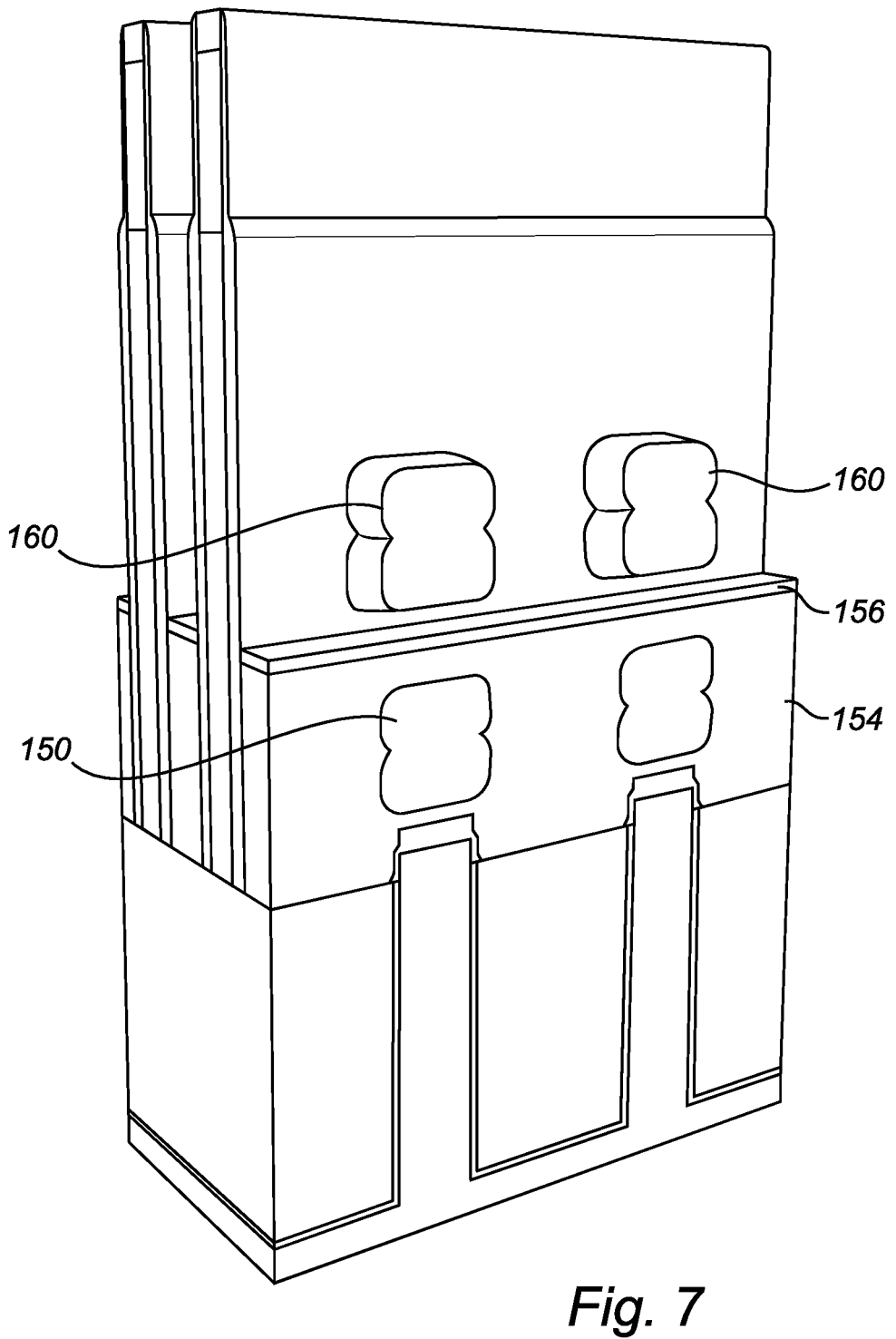

In FIG. 7, top source/drain bodies 160 for each top transistor device have been formed by epitaxy at either side of each sacrificial gate 140. The top source/drain bodies 160 can be formed over the dummy layer 154 and the capping layer 156. The top source/drain bodies 160 may be formed with a desired conductivity type for the top transistor devices, e.g., n-type bodies on Si top channel layers 134 or p-type bodies on SiGe-channel top channel layers 134. The doping may be provided by in-situ doping. During the epitaxy of the top source/drain bodies 160, the dummy layer 154 and the capping layer 156 can act as an epitaxy mask, counteracting epitaxial growth on the bottom source/drain bodies 150. Meanwhile, the capping layer 156 can counteract epitaxial growth on the dummy layer 154.

Figure 8:
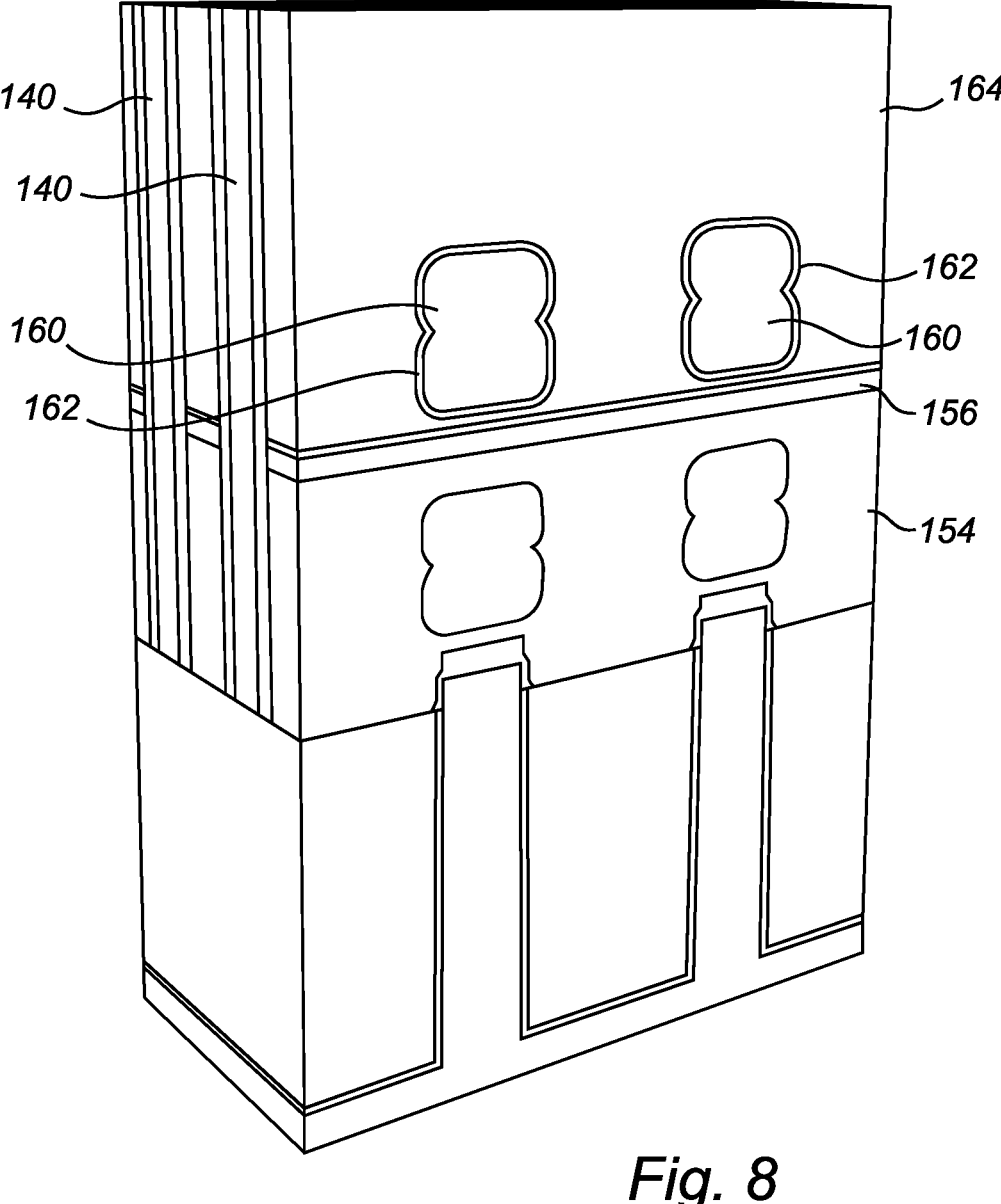

In FIG. 8, an insulating material 164 has been deposited over the dummy layer 154, the capping layer 156, and the top source/drain bodies 160. The insulating material 164 may be an oxide such as $SiO_2$, e.g., deposited by CVD such as FCVD, or some other suitable low-k inter-layer dielectric.

The insulating material 164 may be deposited top-down to surround and cover the sacrificial gates 140 and the top source/drain bodies 160, and e.g., form an overburden over the sacrificial gates 140. The insulating material 164 may after deposition be subjected to a planarization process, e.g., chemical mechanical polishing (CMP), planarizing the insulating material 164 and removing the hard mask stack 141 to expose an upper surface of the sacrificial gates 140.

Prior to depositing the insulating material 164, a contact etch stop layer (CESL) 162 may as shown be formed on the top source/drain bodies 160. The CESL 162 may e.g., be formed by an ALD-deposited nitride, such as SiN.

Figure 9:
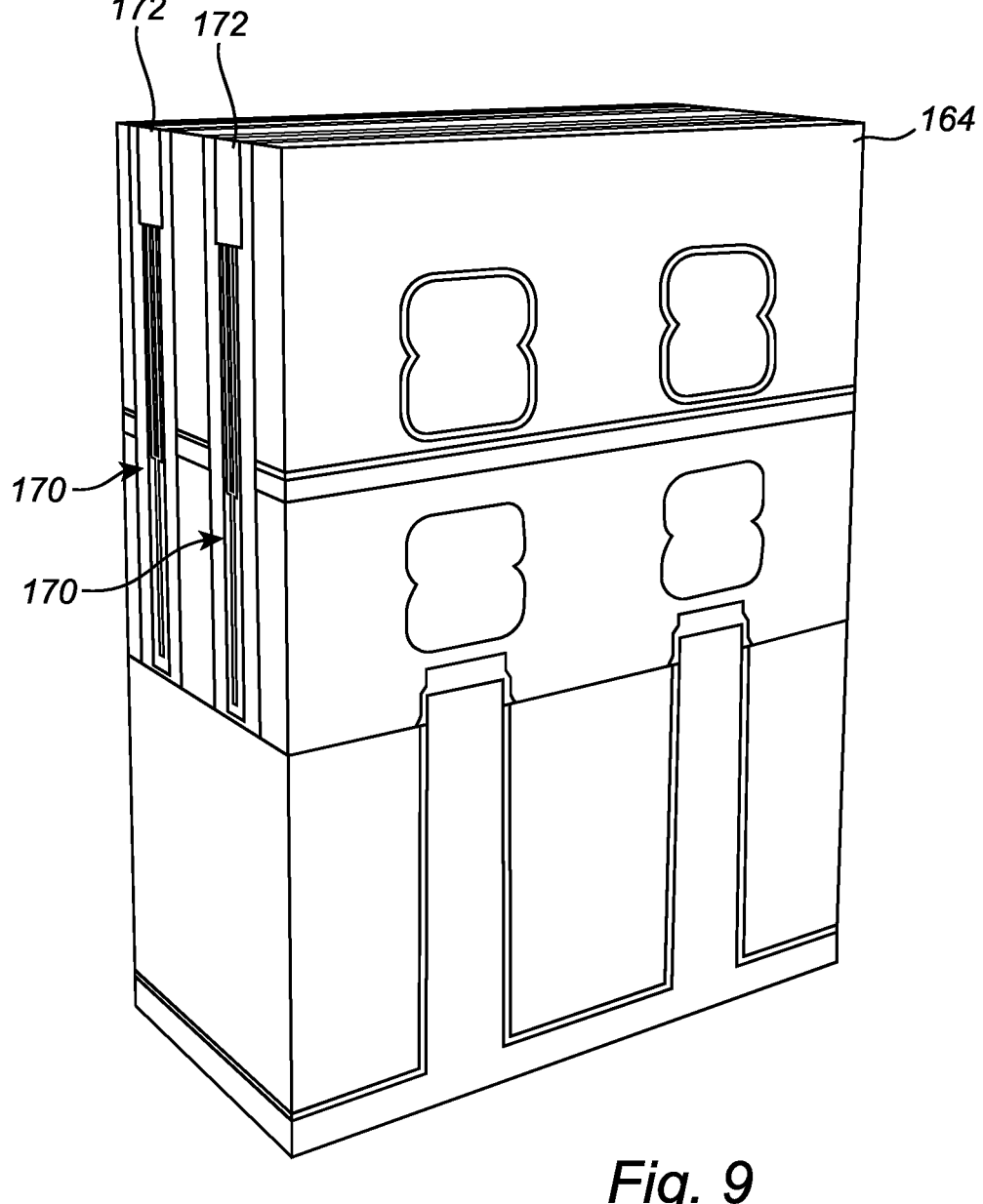

In FIG. 9, each sacrificial gate 140 has been replaced with a functional gate stack 170 using an RMG process. The RMG process may comprise removing the sacrificial gates 140 to form gate trenches exposing the bottom and top device sub-stacks in the channel regions, and subsequently depositing the functional gate stack 170 in the gate trenches, to surround the bottom and top channel layers 114, 134 exposed in each gate trench.

The gate stack may comprise a gate dielectric layer, one or more effective a work function metal (WFM) layers and a gate fill metal. The gate dielectric layer may be formed of any high-k dielectric e.g., $HfO_2$, HfSiO, LaO, AlO or ZrO. The WFM layer may be formed of one or more effective WFMs (e.g., an n-type WFM such as TiAl or TiAlC and/or a p-type WFM such as TiN or TaN). The gate fill metal may be formed of any gate fill metals e.g., W, Al, Co or Ru. The gate dielectric layer and the first WFM may be deposited by ALD. The gate fill metal may for instance be deposited by CVD or PVD. The gate stack may after deposition be recessed using a metal etch-back process to provide the functional gate stacks 170 with a desired vertical dimension and then be covered by a gate cap 172, e.g., of a nitride such as SiN.

After removing the sacrificial gates 140 and prior to depositing the gate stack 170, a "channel release process" may be performed to remove the sacrificial layers 112, 132 of the bottom and top device sub-stacks 110, 130, using an etching process etching the sacrificial layers 112, 132 selectively to the channel layers 114, 134. Thereby the bottom and top channel layers 114, 134 may be "released", such that the gate stack 170 deposited in each gate trench may be formed all-around the channel layers 114, 134.

Figure 10:
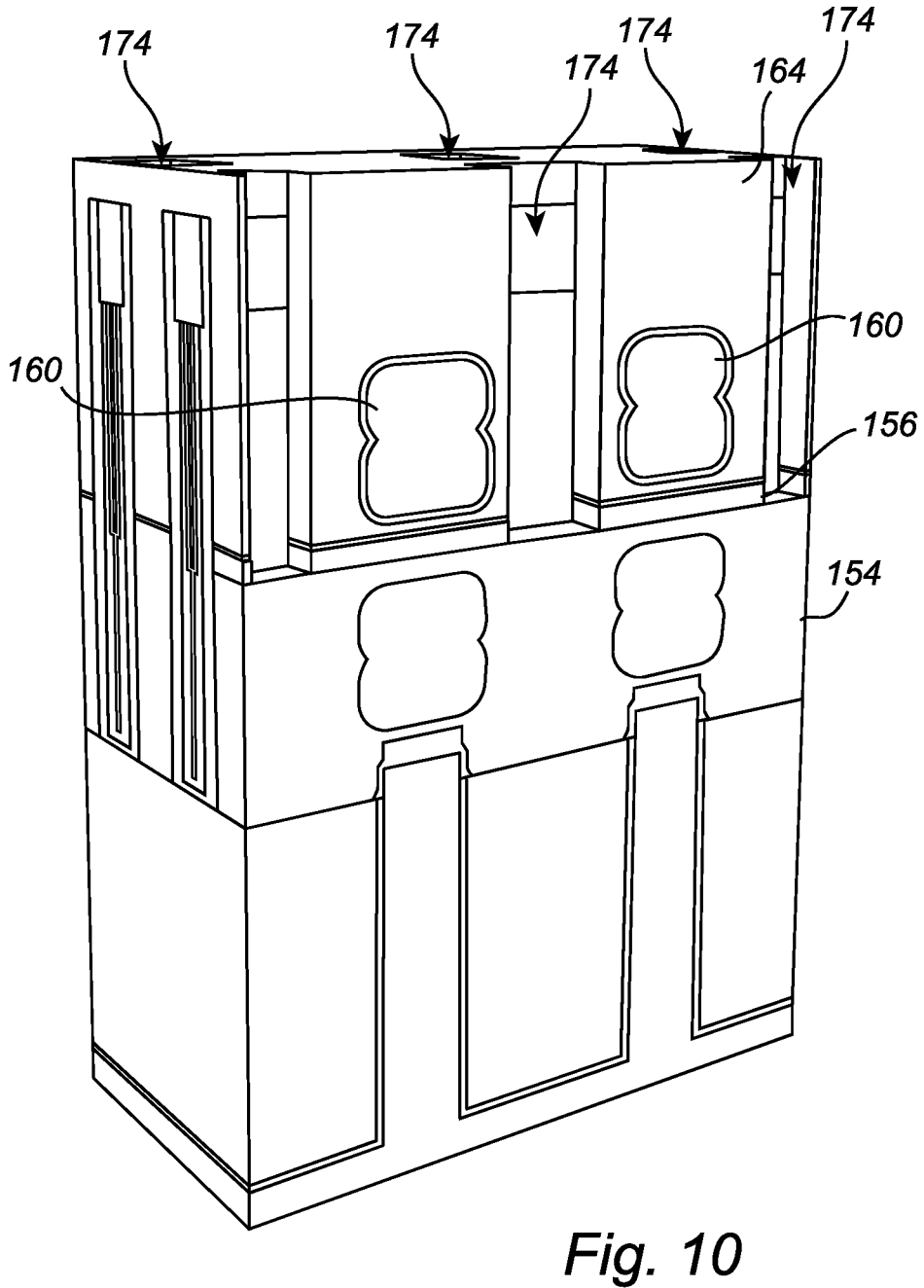

In FIG. 10, a set of holes 174 have been patterned to extend through the insulating material 164 and through the capping layer 156. Each hole 174 can expose an upper surface portion of the dummy contact layer 154. More specifically, each hole 174 can expose an upper surface portion of a dummy contact block 154. It is noted that at this stage, the dummy contact blocks 154 can be un-patterned, e.g., have not yet been patterned. The holes 174 may be patterned using a lithography and etching process.

As shown, each dummy contact block 154 may be exposed by a number holes 174, however at least one. In the illustrated example, a hole 174 can be patterned between each pair of adjacent top source/drain bodies 160. Each hole 174 can be formed at a position between a pair of adjacent top source/drain bodies 160 and formed with a width (along the Y-direction) such that opposing side surfaces of the pair of adjacent top source/drain bodies 160 remain covered by the insulating material 174. For example, the holes 174 may not expose the top source/drain bodies 160 (nor the CESL 162 thereon, if present).

Figure 11:
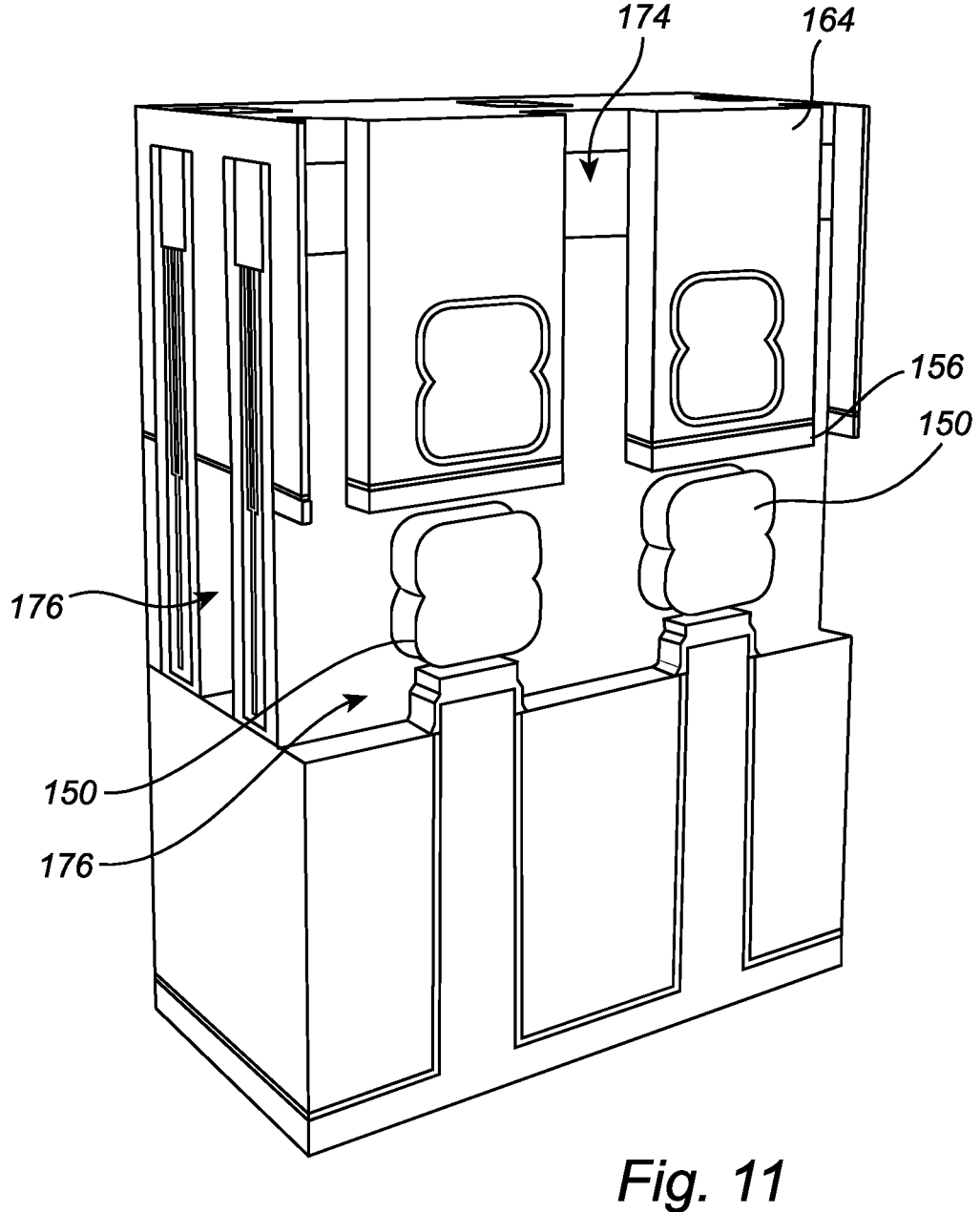
Figure 12:
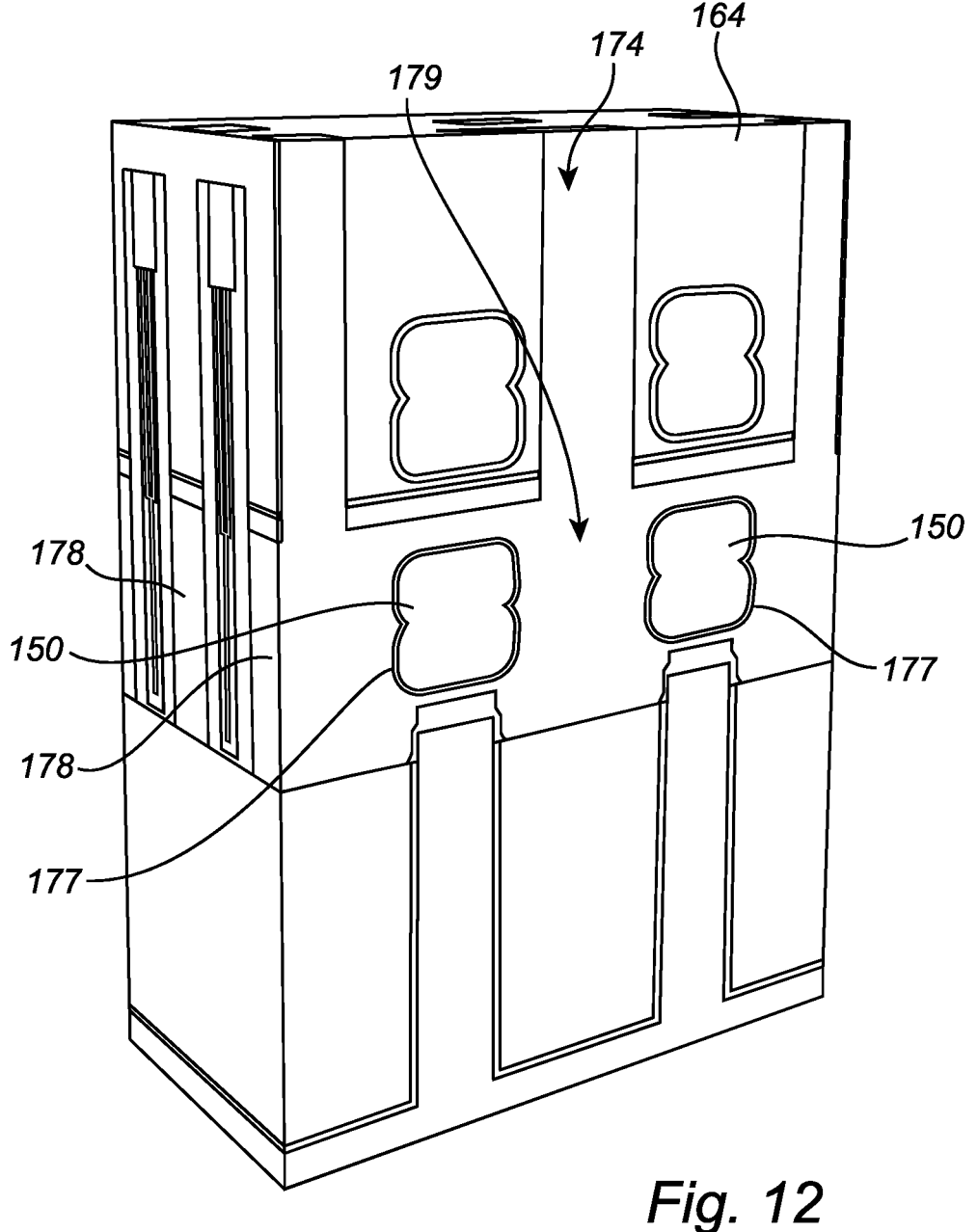

FIGS. 11-12 depict a replacement metal contact process, wherein the bottom dummy contact layer/dummy contact blocks 154 is/are replaced with contact metal 178.

In FIG. 11, the dummy layer/dummy contact blocks 154 have been removed by etching the dummy material (e.g. a-Si or a-SiGe) via the holes 174 using an isotropic etching process (wet or dry). As indicated in FIG. 11, the dummy material may be etched selectively to the oxidized dummy material of the capping layer 156 such that the capping layer 156 may remain over each bottom source/drain body 150. The removal of the dummy layer 154 can create elongated spaces or cavities 176 extending underneath the insulating layer 164 and exposing the bottom source/drain bodies 150.

In FIG. 12 the replacement metal contact process is completed by depositing a contact metal 178 in the cavities 176 via the holes 174. The contact metal 178 can be deposited to fill the cavities 176 and holes 174. An overburden of contact metal 178 deposited over the insulating material 164 may be removed by a planarization and/or metal etch back process. While FIG. 12 depicts a single contact metal 178, it is possible to fill the cavities 176 and holes 174 with one or more contact metals, such as a barrier metal (e.g., TiN) and a fill metal (e.g., W, Al or Ru). Prior to depositing the contact metal 178, a contact silicide 177 may be formed on each bottom source/drain body 150. Silicide formation may be done using any techniques, e.g., by depositing a suitable metal (such as Ti) followed by anneal to trigger silicidation. After anneal, non-silicided metal may be removed by a metal etch (e.g., isotropic, wet or dry).

Figure 13:
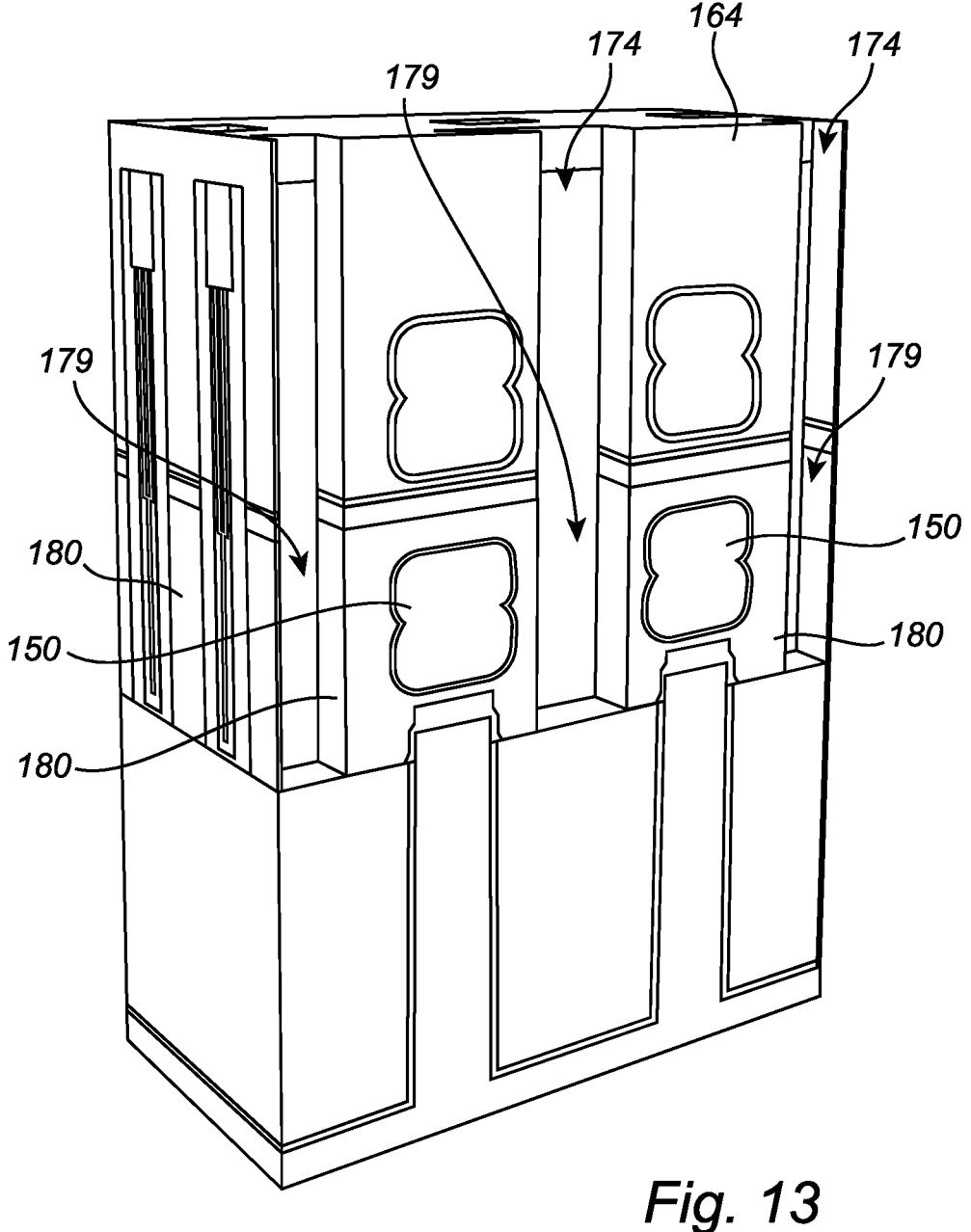

In FIG. 13, the contact metal 178 has been etched back via the holes 174 to form cuts 179 extending through the contact metal 178 and thereby partitioning the contact metal 178 in each cavity 176 into a number of discrete bottom source/drain contacts 180 for the bottom transistor devices. In the illustrated example, an individual bottom source/drain contact 180 is formed in contact with each bottom source/drain body 150.

Figure 14:
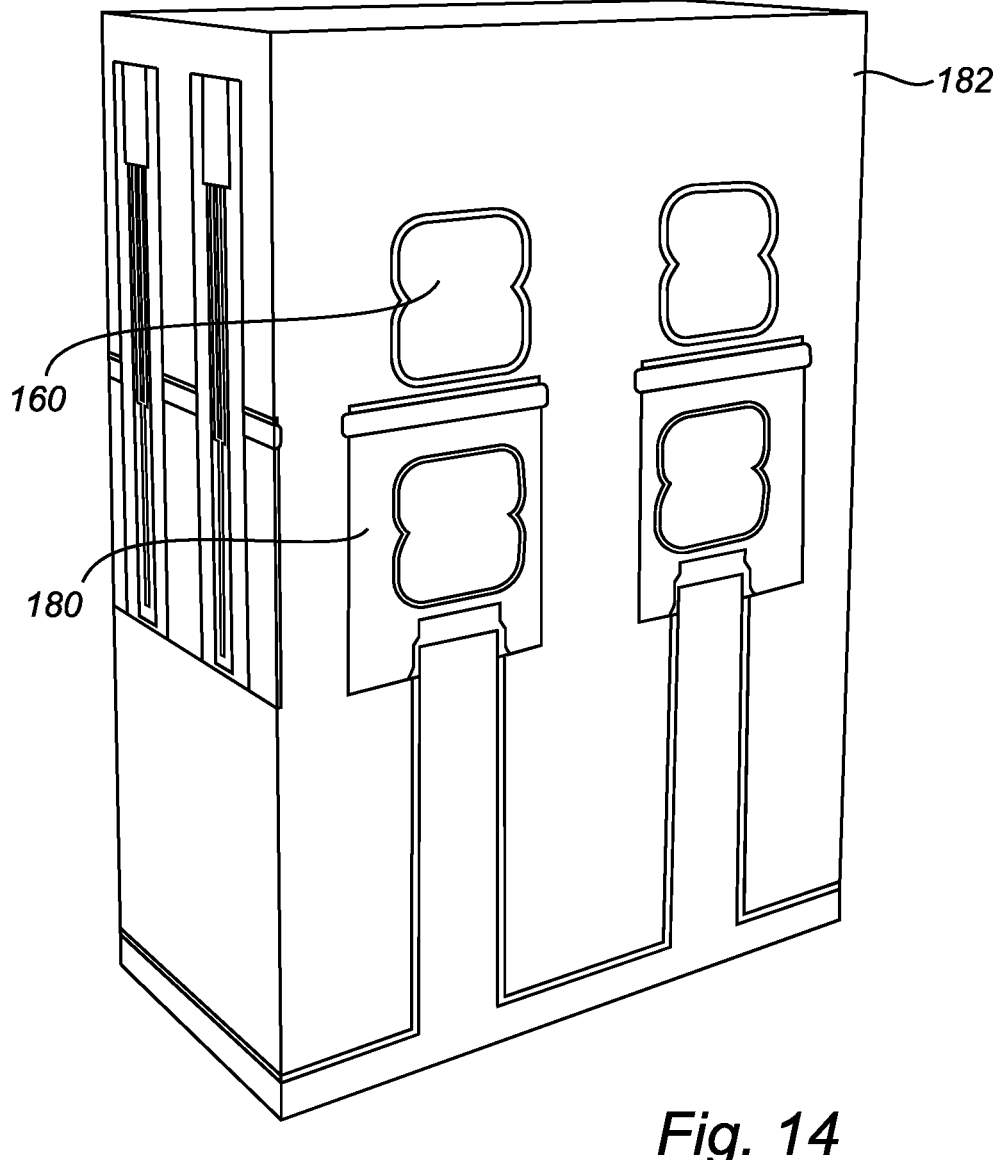

In FIG. 14, the cuts 179 and holes 174 have been filled or "plugged" with an insulating material, e.g., any one of the material examples mentioned in connection with the insulating material 164. In FIG. 14, a same insulating material as the insulating material 164 has been deposited to fill the cuts 179 and holes 174 and hence a single continuous layer of insulating material 182 embedding the bottom source/drain contacts 180 and the top source/drain bodies 160 is depicted.

Figure 15:
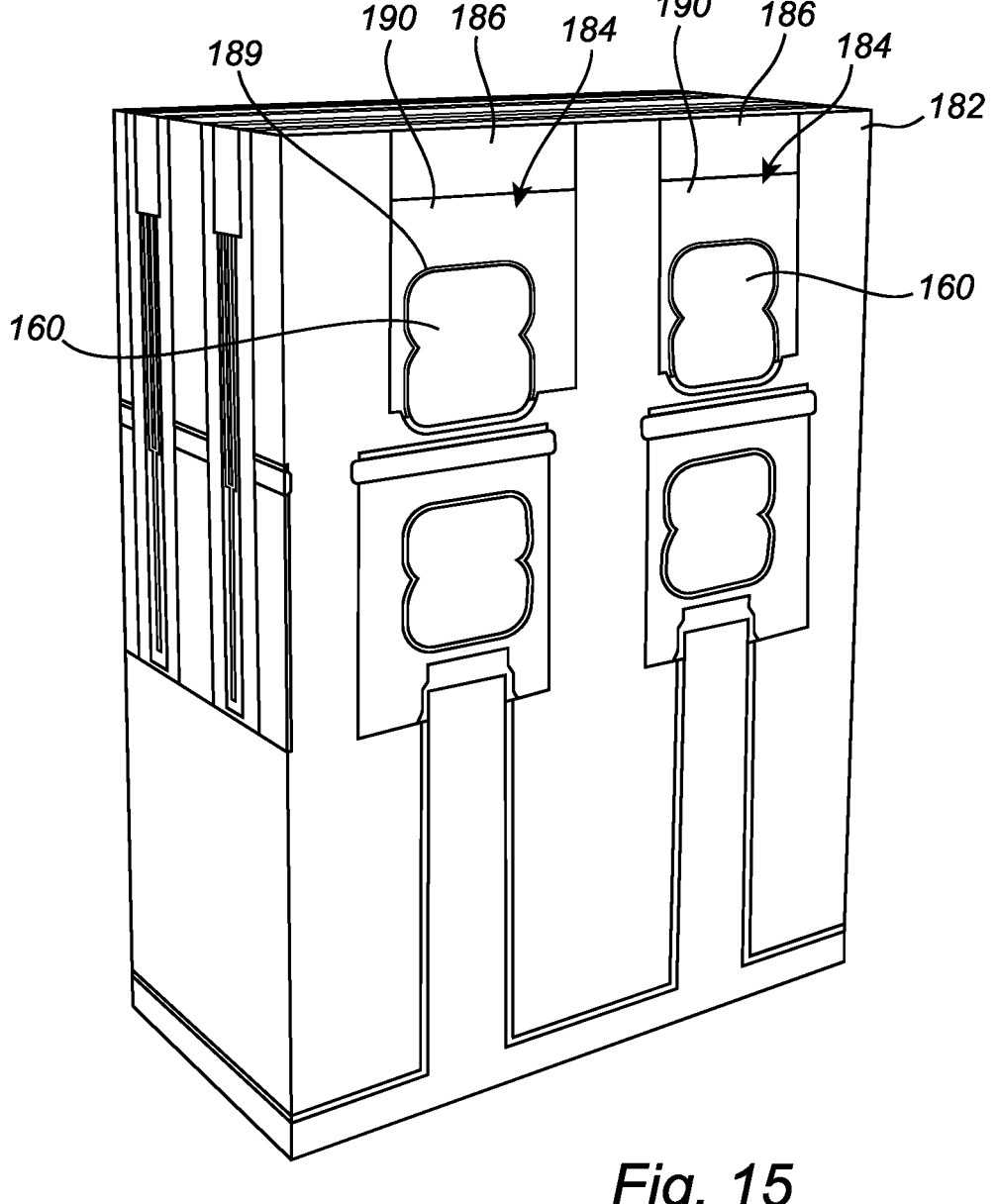

In FIG. 15, contact holes 184 have been etched in the insulating material 182 deposited over the top source/drain bodies 160. The contact holes may be formed using a resist-based mask patterned with a contact hole pattern using lithography. The etching has as shown been stopped prior to exposing the bottom source/drain contacts 180. Top source/drain contacts 190 have subsequently been formed in the contact holes 184, e.g., after opening the CESL 162 from the contact holes 184. The top source/drain contacts may be formed by depositing one or more contact metals in the contact holes 184. An overburden of contact metal may subsequently be removed by a planarization and/or metal etch back process. The contact formation may further comprise recessing the top source/drain contacts 182 to a desired vertical dimension and then be covered by a contact cap 186. The deposition of contact metal may be preceded by forming a contact silicide 189 on the top source/drain bodies 160, in similar manner as discussed in connection with the bottom source/drain contacts 180.

Figure 16:
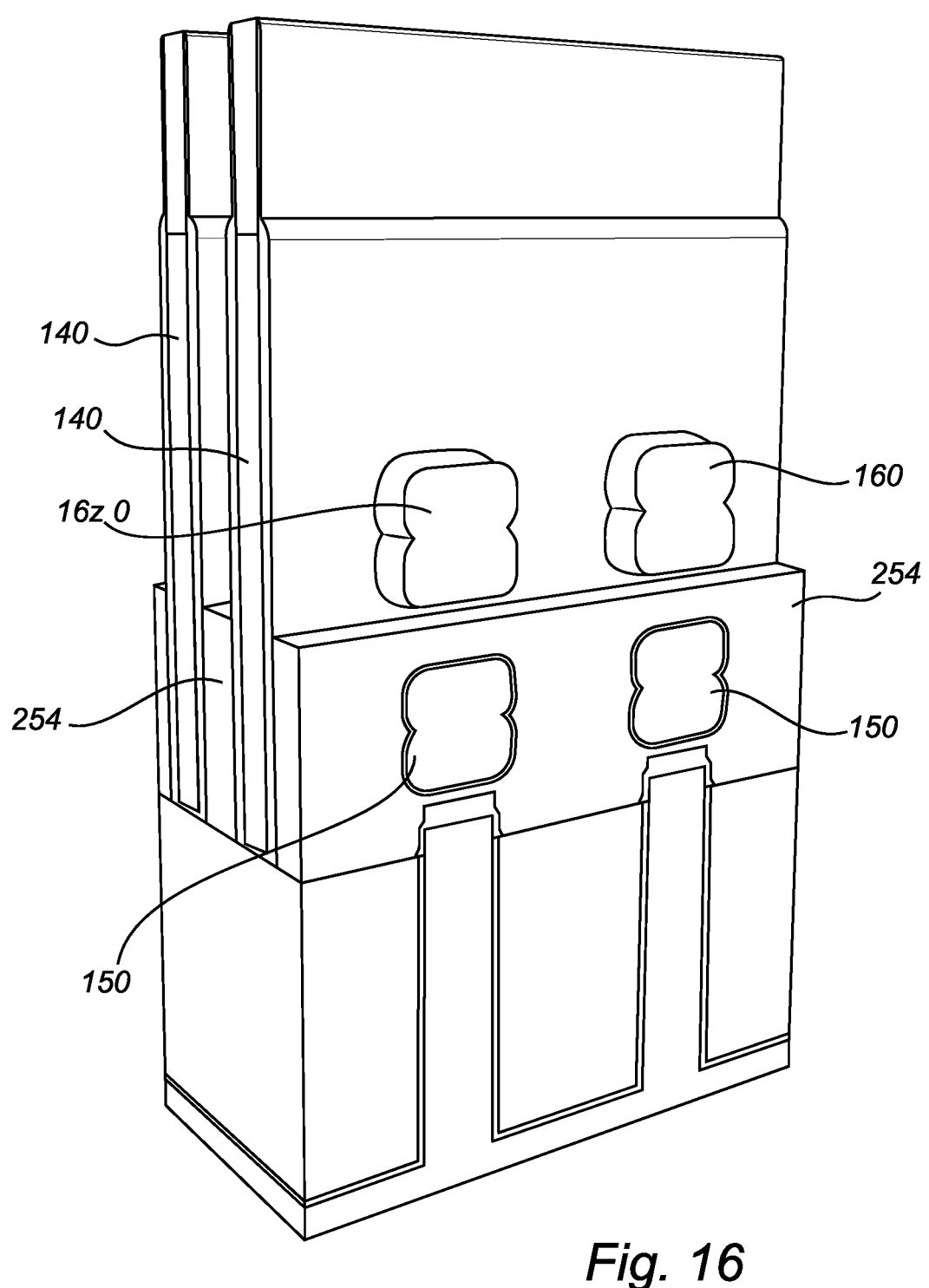
FIGS. 16, 17, and 18 depict various intermediate structures at various stages of a method of forming stacked transistor devices according to another embodiment.
Figure 17:
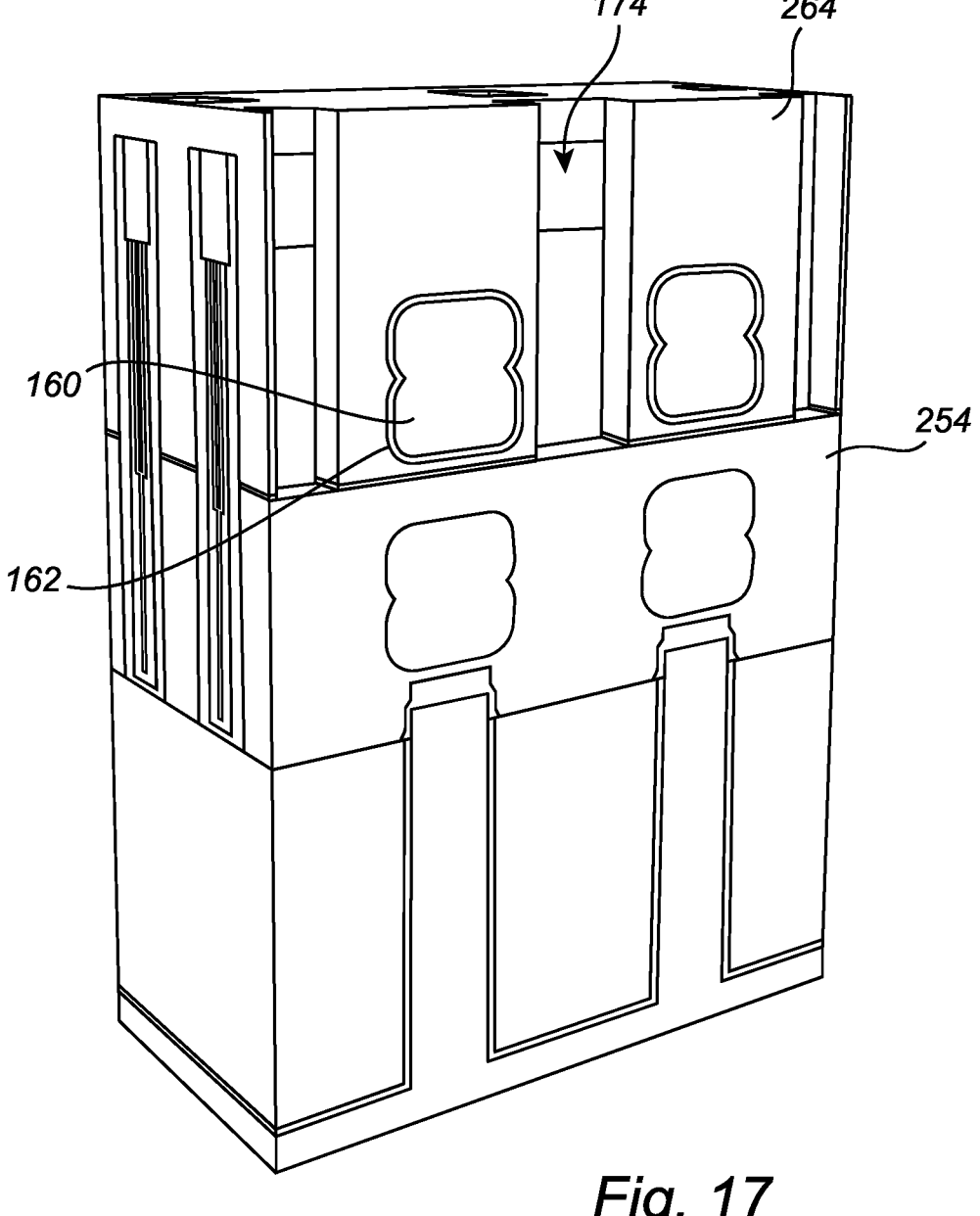
Figure 18:
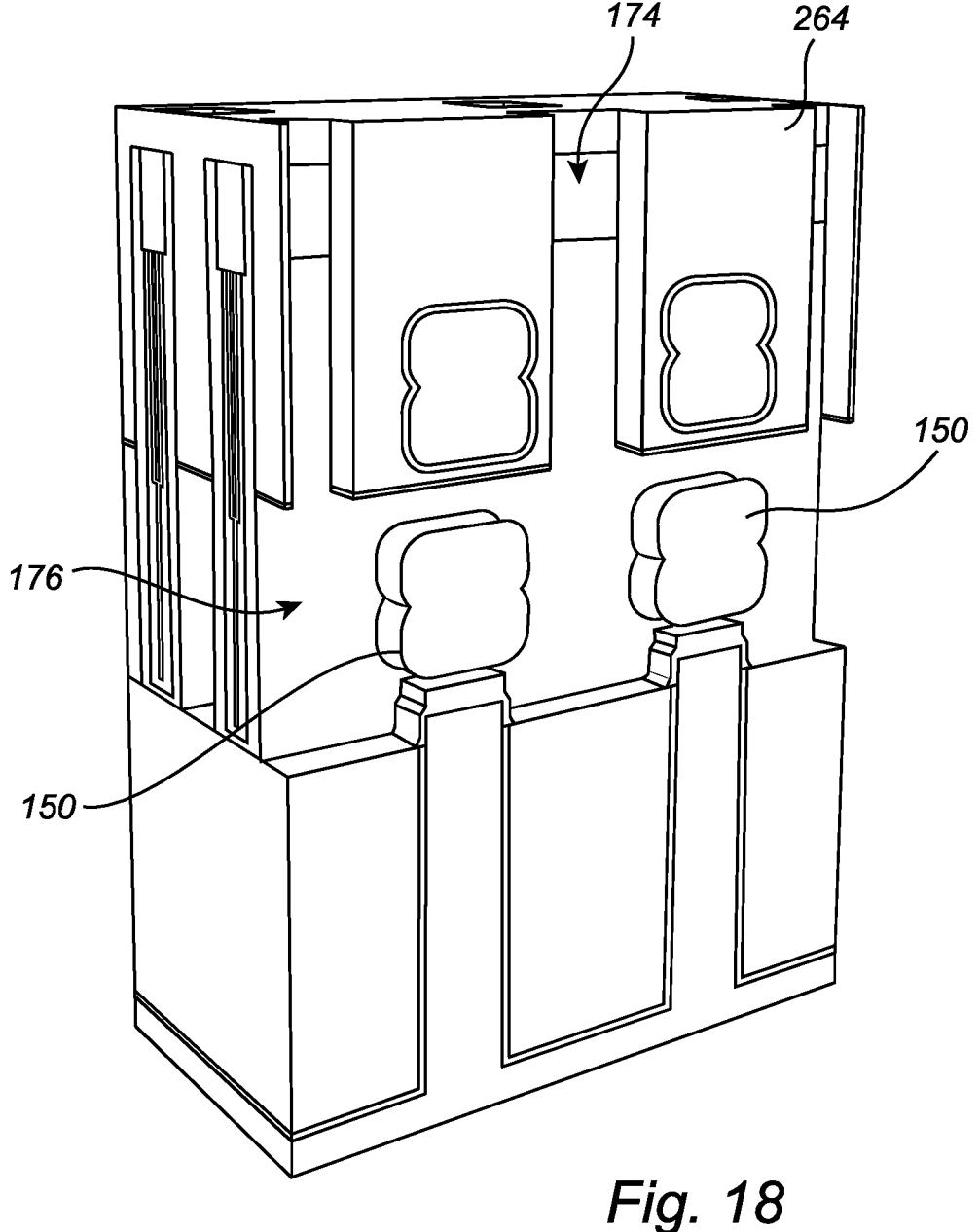

FIGS. 16-18 depict an alternative embodiment of forming a bottom dummy contact layer.

FIG. 16 depicts the structure at a stage wherein bottom source/drain bodies 150 have been formed and subsequently covered by bottom dummy contact layer 254. The dummy layer 254 may be formed in a manner similar to the dummy layer 154, however instead of being formed of a-Si or a-SiGe, the dummy material can be a first insulating material, e.g. a silicon-comprising oxide, such as $SiO_x$. After deposition (e.g. by CVD, F-CVD or PVD) the dummy material can be etched back to remove a top portion of the dummy material such that a bottom portion of the dummy material remains to cover the bottom source/drain bodies 150, as shown in FIG. 16.

After forming the dummy layer 254, top source/drain bodies 160 have been formed and then covered with a second insulating material 264 (see FIG. 17). Prior to depositing the second insulating material 264, the top source/drain bodies 160 may be provided with a CESL 162. The second insulating material 264 can be different from the first insulating material 254. In case the first insulating material is a silicon-comprising oxide (e.g., $SiO_x$) the second insulating material may also be a silicon-comprising oxide but with a greater carbon content than the first insulating material, e.g., SiOC with a 10-30% carbon content.

Holes 174 may subsequently be patterned to extend through the second insulating material 264 and exposing upper surface portions of the dummy layer 254. Due to the different carbon-content of the dummy layer 254 and second insulating material 264, the dummy layer 254 may subsequently be removed selectively to the second insulating material 264, e.g., using a wet or dry HF-etching chemistry, to form cavities 176 as shown in FIG. 18. The replacement metal contact process may then be completed by filling the cavities 176 and the holes 174 with the contact metal 178. The method may then proceed as outlined in connection with FIG. 12 and onwards.

In the above, the disclosed technology has mainly been described with reference to a limited number of examples. However, as is readily appreciated by a person skilled in the art, other examples than the ones disclosed above are equally possible within the scope of the disclosed technology, as defined by the appended claims.

What is claimed is:

1. A method of forming a semiconductor device comprising a plurality of stacked transistor devices each comprising a bottom transistor device and a top transistor device, the method comprising:

forming a plurality of parallel fin structures on a substrate, each of the fin structures comprising a bottom device sub-stack comprising a number of bottom channel layers and a top device sub-stack comprising a number of top channel layers;

forming a sacrificial gate across the fin structures;

forming bottom source/drain bodies for each bottom transistor device by epitaxy;

forming a bottom dummy contact layer covering the bottom source/drain bodies, comprising depositing a dummy material over the bottom source/drain bodies, and removing a top portion of the dummy material by an etch back process such that a bottom portion of the dummy material remains to cover the bottom source/drain bodies;

forming top source/drain bodies for each top transistor device over the bottom dummy contact layer by epitaxy;

depositing an insulating material over the bottom dummy contact layer and the top source/drain bodies;

subsequent to depositing the insulating material, replacing the sacrificial gate with a functional gate stack by a replacement metal gate process;

subsequent to the replacement metal gate process, patterning holes extending through the insulating material, each hole exposing an upper surface portion of the bottom dummy contact layer;

replacing the bottom dummy contact layer with one or more contact metals, comprising etching the dummy material via the holes and thereafter depositing the one or more contact metals via the holes;

etching cuts through the one or more contact metals via the holes, thereby forming bottom source/drain contacts for the bottom transistor devices; and filling the cuts and holes with an insulating material.

2. The method according to claim 1, wherein the dummy material is an amorphous silicon or silicon-germanium material, and wherein the method further comprises, after the etch back process of the dummy material, oxidizing a top thickness portion of the bottom portion of the dummy material, thereby forming the bottom dummy contact layer and a capping layer of oxidized dummy material on top.

3. The method according to claim 2, wherein the replacing of the bottom dummy contact layer comprises etching the dummy material selectively to the oxidized dummy material, wherein subsequent to etching the cuts through the one or more contact metals, a capping layer portion remains on top of each bottom source/drain contact.

4. The method according to claim 1, wherein the dummy material is a first insulating material and said insulating material deposited over the bottom dummy contact layer and the top source/drain bodies is a second insulating material different from the first insulating material, and wherein the replacing of the bottom dummy contact layer comprises etching the first insulating material selectively to the second insulating material.

5. The method according to claim 4, wherein the first insulating material is a silicon-comprising oxide and the second insulating material is a silicon-comprising oxide material with a greater carbon content than the first insulating material.

6. The method according to claim 5, wherein the carbon content of the second insulating material is 10 to 30 percentage units greater than the carbon content of the first insulating material.

7. The method according to claim 1, further comprising, subsequent to filling the cuts and holes, etching contact holes in the insulating material deposited over the top source/drain bodies, wherein the etching is stopped prior to exposing the bottom source/drain contacts, and forming top source/drain contacts in the contact holes.

8. The method according to claim 7, further comprising forming a contact etch stop layer on the top source/drain bodies prior to depositing the insulating material over the bottom dummy contact layer and the top source/drain bodies, wherein the method further comprises opening the contact etch stop layer from the contact holes and thereafter forming the top source/drain contacts.

9. The method according to claim 1, wherein each hole is formed at a position between a pair of adjacent top source/drain bodies and with a width such that opposing side surfaces of the pair of adjacent top source/drain bodies remain covered by the insulating material.

10. The method according to claim 1, wherein each hole is patterned between a pair of adjacent top source/drain bodies.

11. The method according to claim 1, wherein each fin structure further comprises a middle insulating layer intermediate the bottom device sub-stack and the top device sub-stack, wherein the etch back process of the dummy material is stopped at a level of the middle insulating layer.

12. The method according to claim 1, wherein the sacrificial gate is formed to overlap a respective channel region of each fin structure, and wherein the method further comprises:

etching back the fin structure at either side of the sacrificial gate;

forming a cover spacer with an extension to cover end surfaces of the upper device sub-stack defined by the etch back at either side of the sacrificial gate, and to expose end surfaces of the bottom device sub-stack defined by the etch back at either side of the sacrificial gate; and thereafter forming the bottom source/drain bodies while using the cover spacer as an epitaxy mask.

13. The method according to claim 1, wherein the bottom source/drain bodies and the top source/drain bodies are oppositely doped.

14. The method according to claim 1, wherein the bottom device sub-stack further comprises a number of sacrificial layers arranged alternatively with the bottom channel layers.

15. The method according to claim 1, wherein the top device sub-stack further comprises a number of sacrificial layers arranged alternatively with the top channel layers.

16. The method according to claim 1, wherein the bottom dummy contact layer forms a continuous block across all the bottom source/drain bodies on a side of the sacrificial gate.

17. The method according to claim 1, wherein etching cuts comprises patterning the one or more contact metals, thereby forming a number of discrete bottom source/drain contacts.

18. The method according to claim 1, wherein the plurality of stacked transistor devices comprises complementary field-effect transistor devices.

* * * * *